US010774420B2

(12) United States Patent
Terada et al.

(10) Patent No.: US 10,774,420 B2
(45) Date of Patent: Sep. 15, 2020

(54) FLOW PASSAGE STRUCTURE AND PROCESSING APPARATUS

(71) Applicant: Kabushiki Kaisha Toshiba, Minato-ku (JP)

(72) Inventors: Takahiro Terada, Yokohama (JP); Shiguma Kato, Yokohama (JP); Shinya Higashi, Yokohama (JP); Masayuki Tanaka, Yokohama (JP); Takuya Matsuda, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 435 days.

(21) Appl. No.: 15/757,382

(22) PCT Filed: Jun. 26, 2017

(86) PCT No.: PCT/JP2017/023442
§ 371 (c)(1),
(2) Date: Mar. 5, 2018

(87) PCT Pub. No.: WO2018/047440
PCT Pub. Date: Mar. 15, 2018

(65) Prior Publication Data
US 2020/0232095 A1    Jul. 23, 2020

(30) Foreign Application Priority Data
Sep. 12, 2016   (JP) ................. 2016-177821

(51) Int. Cl.
*C23C 16/455* (2006.01)
*H01L 21/67* (2006.01)

(52) U.S. Cl.
CPC ...... *C23C 16/455* (2013.01); *C23C 16/45563* (2013.01); *C23C 16/45565* (2013.01); *C23C 16/45574* (2013.01); *H01L 21/67017* (2013.01)

(58) Field of Classification Search
CPC ............ C23C 16/455; C23C 16/45563; C23C 16/45565; C23C 16/45574; H01L 21/67017
See application file for complete search history.

(56) References Cited

U.S. PATENT DOCUMENTS 5,595,606 A    1/1997  Fujikawa et al.
5,624,498 A    4/1997  Lee et al.
(Continued)

FOREIGN PATENT DOCUMENTS

JP    02-170534 A    7/1990
JP    05-152208 A    6/1993
(Continued)

OTHER PUBLICATIONS

International Search Report dated Sep. 12, 2017 in PCT/JP2017/023442, filed on Jun. 26, 2017 ( with Translation of Category of Cited Documents in attached foreign language Search Report).

*Primary Examiner* — Jeffrie R Lund
(74) *Attorney, Agent, or Firm* — Oblon, McClelland, Maier & Neustadt, L.L.P.

(57) ABSTRACT

According to an embodiment, a flow passage structure includes a member. The member has a surface and is provided with a first passage, a plurality of first openings, a second passage, and a plurality of second openings. The first passage includes a plurality of first closed path portions connected to each other. The first openings is connected to the first passage and is opened in the surface. The second passage includes a plurality of second closed path portions connected to each other. The second openings is connected to the second passage and is opened in the surface. The first closed path portions pass through the second closed path portions while being isolated from the second closed path portions. The second closed path portions pass through the (Continued)

first closed path portions while being isolated from the first closed path portions.

11 Claims, 20 Drawing Sheets

(56) References Cited

U.S. PATENT DOCUMENTS

| | | | |
|---|---|---|---|
| 5,963,834 A | 10/1999 | Hatano et al. | |
| 6,068,703 A * | 5/2000 | Chen | B01F 5/064 |
| | | | 118/715 |
| 6,126,753 A | 10/2000 | Shinriki et al. | |
| 6,143,081 A | 11/2000 | Shinriki et al. | |
| 6,148,761 A | 11/2000 | Majewski et al. | |
| 6,302,964 B1 | 10/2001 | Umotoy et al. | |
| 6,303,501 B1 * | 10/2001 | Chen | C23C 16/08 |
| | | | 137/3 |
| 6,428,850 B1 | 8/2002 | Shinriki et al. | |
| 2004/0134611 A1 | 7/2004 | Kato et al. | |
| 2005/0000423 A1 | 1/2005 | Kasai et al. | |
| 2006/0105104 A1 | 5/2006 | Tada | |
| 2007/0175396 A1 | 8/2007 | Kasai et al. | |
| 2009/0178614 A1 | 7/2009 | Kasai et al. | |
| 2010/0107977 A1 | 5/2010 | Kasai et al. | |
| 2011/0265887 A1 | 11/2011 | Lee et al. | |
| 2013/0068161 A1 | 3/2013 | White et al. | |
| 2013/0299009 A1 | 11/2013 | Jiang et al. | |
| 2016/0208380 A1 | 7/2016 | White et al. | |

FOREIGN PATENT DOCUMENTS

| | | |
|---|---|---|
| JP | 07-201762 A | 8/1995 |
| JP | 2001-323377 A | 11/2001 |
| JP | 2002-518839 A | 6/2002 |
| JP | 336009882 | 12/2002 |
| JP | 3476638 B2 | 12/2003 |
| JP | 3591218 B2 | 11/2004 |
| JP | 2007-173848 A | 7/2007 |
| JP | 3968869 B2 | 8/2007 |
| JP | 4151308 B2 | 9/2008 |
| JP | 2008-235611 A | 10/2008 |
| JP | 2009-259907 A | 11/2009 |
| JP | 4575640 B2 | 11/2010 |
| JP | 4782761 B2 | 9/2011 |
| JP | 4889683 B2 | 7/2012 |
| JP | 2013-239707 A | 11/2013 |
| JP | 2014-535001 A | 12/2014 |
| JP | 5658701 B2 | 1/2015 |
| JP | 5752238 B2 | 7/2015 |
| KR | 10-2013-0126477 A | 11/2013 |
| WO | 2008/114799 A1 | 9/2008 |

* cited by examiner

FLOW PASSAGE STRUCTURE AND PROCESSING APPARATUS

CROSS-REFERENCE TO RELATED APPLICATIONS

This application is national stage application of International Application No. PCT/JP2017/023442, filed Jun. 26, 2017, which designates the United States, incorporated herein by reference, and which claims the benefit of priority from Japanese Patent Application No. 2016-177821, filed Sep. 12, 2016, the entire contents of which are incorporated herein by reference.

FIELD

Embodiments described herein relate generally to flow passage structure and a processing apparatus.

BACKGROUND

In apparatuses for sucking or discharging fluids from a plurality of openings, a member is known to suck or discharge a plurality of kinds of fluids. For example, a plurality of kinds of fluids is diffused in a plurality of passages formed by the member, and is discharged from a plurality of openings.

DETAILED DESCRIPTION

In general, according to one embodiment, a flow passage structure includes a member. The member has a surface and is provided with a first passage, a plurality of first openings, a second passage, and a plurality of second openings. The first passage includes a plurality of first closed path portions connected to each other. The plurality of first openings is connected to the first passage and is opened in the surface. The second passage includes a plurality of second closed path portions connected to each other. The plurality of second openings is connected to the second passage and is opened in the surface. The first closed path portions pass through the second closed path portions while being isolated from the second closed path portions. The second closed path portions pass through the first closed path portions while being isolated from the first closed path portions.

A first embodiment will be described below with reference to FIGS. 1 to 8. Note that in the present description, basically, a vertically upward direction is defined as an upper direction, and a vertically downward direction is defined as a lower direction. Furthermore, in the present description, a plurality of expressions is sometimes used for component elements according to embodiments and the description of the component elements. Other expressions, which are not described yet, may be used for the respective component elements and descriptions thereof having the plurality of expressions. Furthermore, other expressions, which are not described yet, may be used also for respective component elements and description thereof not having a plurality of expressions.

Figure 1:
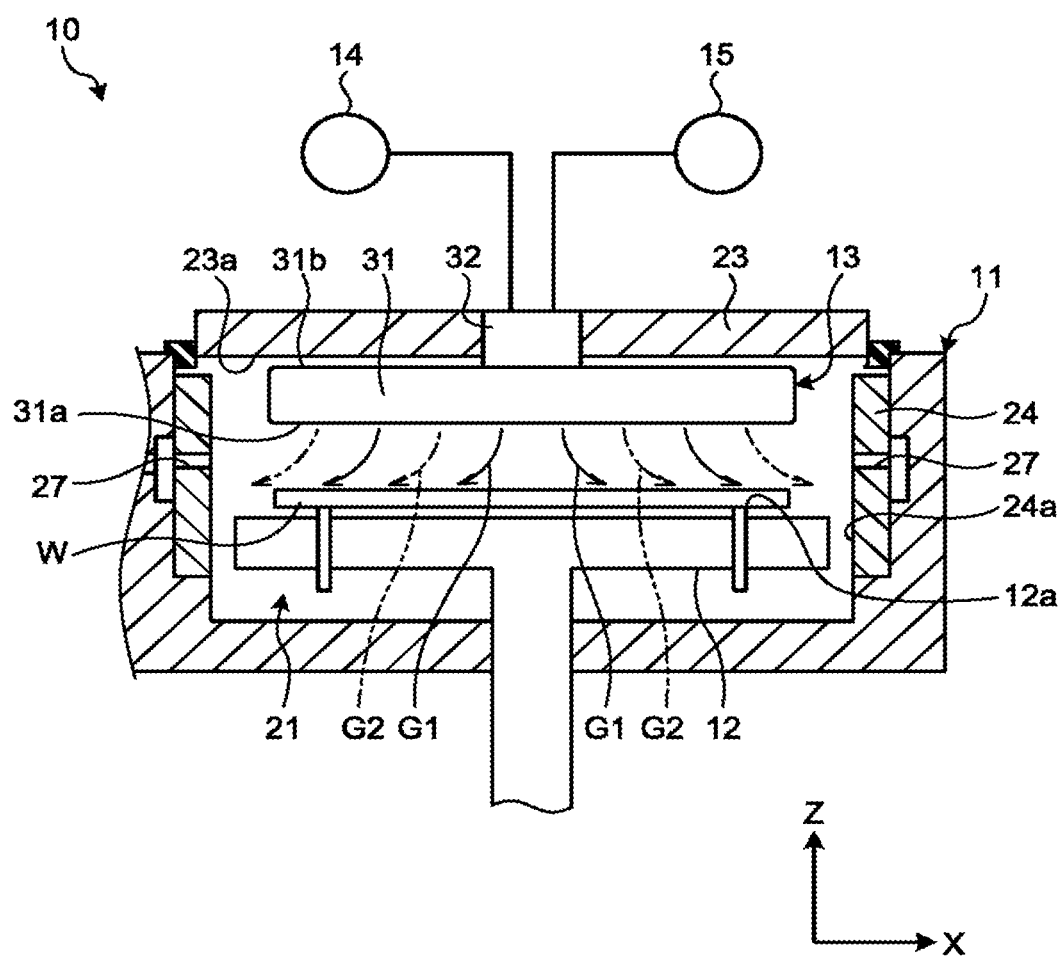
FIG. 1 is a schematic cross-sectional view of a semiconductor manufacturing apparatus according to a first embodiment.

FIG. 1 is a schematic cross-sectional view of a semiconductor manufacturing apparatus 10 according to the first embodiment. The semiconductor manufacturing apparatus 10 is an example of a processing apparatus and, for example, may be also referred to as a manufacturing apparatus, a machining apparatus, a suction-discharge apparatus, a feeding apparatus, or an apparatus. Note that the processing apparatus is not limited to the semiconductor manufacturing apparatus 10 and may be another apparatus for performing processing such as machining, washing, or testing a target object.

As illustrated in the drawings, an X axis, a Y axis, and a Z axis are defined in the present description. The X axis, the Y axis, and the Z axis are orthogonal to each other. The X axis extends along the width of the semiconductor manufacturing apparatus 10. The Y axis extends along the depth (length) of the semiconductor manufacturing apparatus 10. The Z axis extends along the height of the semiconductor manufacturing apparatus 10. In the present embodiment, the Z axis extends in a vertical direction. Note that the direction in which the Z axis extends and the vertical direction may be different from each other.

The semiconductor manufacturing apparatus 10 according to the first embodiment illustrated in FIG. 1 is, for example, a chemical vapor deposition (CVD) apparatus. The semiconductor manufacturing apparatus 10 may be another apparatus. The semiconductor manufacturing apparatus 10 includes a manufacturing unit 11, a stage 12, a shower plate 13, a first pump 14, and a second pump 15.

The manufacturing unit 11 may be also referred to as, for example, casing. The stage 12 is an example of an object support portion and may be also referred to as, for example, mount portion or pedestal. The shower plate 13 is an example of a flow passage structure and a member also being referred to as, for example, branching portion, ejection unit, discharging unit, suction unit, or component.

The first pump 14 is an example of a first fluid feeding unit. The second pump 15 is an example of a second fluid feeding unit. The first pump 14 and the second pump 15 may be also referred to as, for example, feeding unit, discharging unit, or sending unit.

In the manufacturing unit 11, a chamber 21 is provided to be air-tightly sealed. The chamber 21 may be also referred to as, for example, room or space. The semiconductor manufacturing apparatus 10 manufactures a semiconductor wafer (hereinafter, referred to as wafer) W, for example, in the chamber 21. The wafer W is an example of an object. The manufacturing unit 11 includes an upper wall 23 and a peripheral wall 24.

The upper wall 23 includes an inner surface 23a. The inner surface 23a is a substantially flat surface directed downward. The inner surface 23a partially forms the chamber 21. That is, the inner surface 23a is directed to the inside of the chamber 21.

The peripheral wall 24 includes an inner peripheral surface 24a. The inner peripheral surface 24a is a surface directed substantially in a horizontal direction. The inner peripheral surface 24a partially forms the chamber 21. That is, the inner peripheral surface 24a is directed to the inside of the chamber 21. The peripheral wall 24 is provided with a plurality of gas vent holes 27. A gas in the chamber 21 can be sucked from the gas vent holes 27.

The stage 12 and the shower plate 13 are disposed in the chamber 21. Note that, as illustrated in FIG. 1, part of the stage 12 and part of the shower plate 13 may be positioned outside the chamber 21.

The stage 12 includes a support portion 12a. The support portion 12a is directed to the inner surface 23a of the upper wall 23 to support the wafer W. The stage 12 includes a heater to heat the wafer W supported by the support portion 12a.

The stage 12 sucks, for example, the wafer N to secure the wafer W to the support portion 12a. Furthermore, the stage 12 may be configured to be rotated while supporting the wafer W.

The shower plate 13 includes a diffusing unit 31 and a tube portion 32. The diffusing unit 31 is formed into a substantially disc shape expanding on an X-Y plane. The tube portion 32 extends in a positive direction (direction in which a Z axis arrow is directed, upward direction) of the Z axis from substantially the center of the diffusing unit 31.

The tube portion 32 penetrates the upper wall 23. For example, the tube portion 32 is fixed to the upper wall 23 to mount the shower plate 13 to the upper wall 23 of the manufacturing unit 11. Note that the shower plate 13 may be mounted to the manufacturing unit 11 by using other means.

The diffusing unit 31 includes a bottom surface 31a and an upper surface 31b. The bottom surface 31a is an example of a surface and may be also referred to as, for example, outer surface. The bottom surface 31a is formed substantially flat and is directed in a negative direction of the Z axis (direction opposite to the direction in which the Z axis arrow is directed, downward direction).

The bottom surface 31a of the diffusing unit 31 faces the wafer W supported by the support portion 12a of the stage 12. In other words, the stage 12 supports the wafer W at a position to which the bottom surface 31a of the diffusing unit 31 is directed.

The upper surface 31b of the diffusing unit 31 is positioned on the opposite side to the bottom surface 31a. The upper surface 31b is formed substantially flat and is directed in the positive direction of the Z axis. The tube portion 32 extends in the positive direction of the Z axis from the upper surface 31b.

Figure 2:
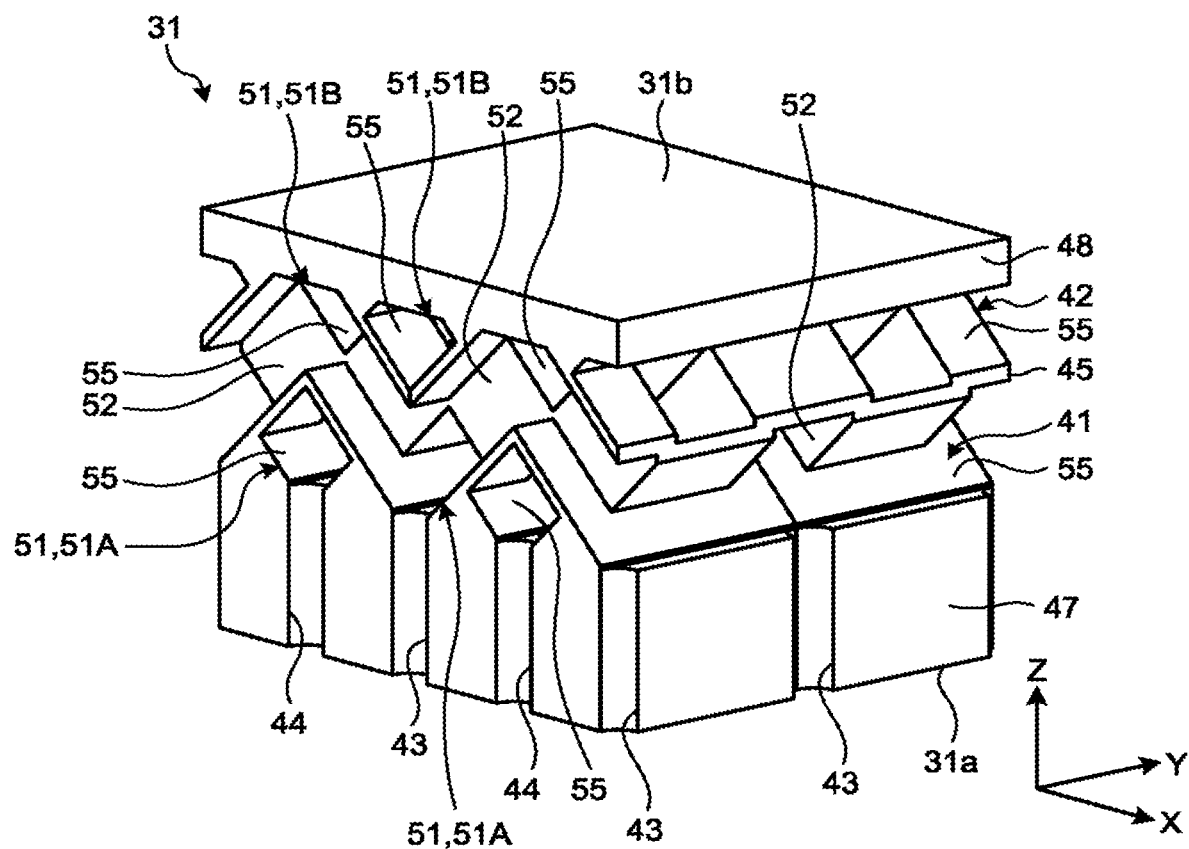
FIG. 2 is a perspective view partially illustrating a diffusing unit according to the first embodiment.

FIG. 2 is a perspective view partially illustrating the diffusing unit 31 according to the first embodiment. As illustrated in FIG. 2, the diffusing unit 31 is provided with a first passage 41, a second passage 42, a plurality of first openings 43, and a plurality of second openings 44.

Each of the first passage 41 and the second passage 42 may be also referred to as, for example, space, room, or flow passage. Each of the first openings 43 and the second openings 44 may be also referred to as vent hole, suction hole, or hole.

Each of the first passage 41 and the second passage 42 is provided in the diffusing unit 31. The second passage 42 is independent of the first passage 41. In other words, the first passage 41 is isolated from the second passage 42 by using a partition wall 45 being part of the diffusing unit 31.

Figure 3:
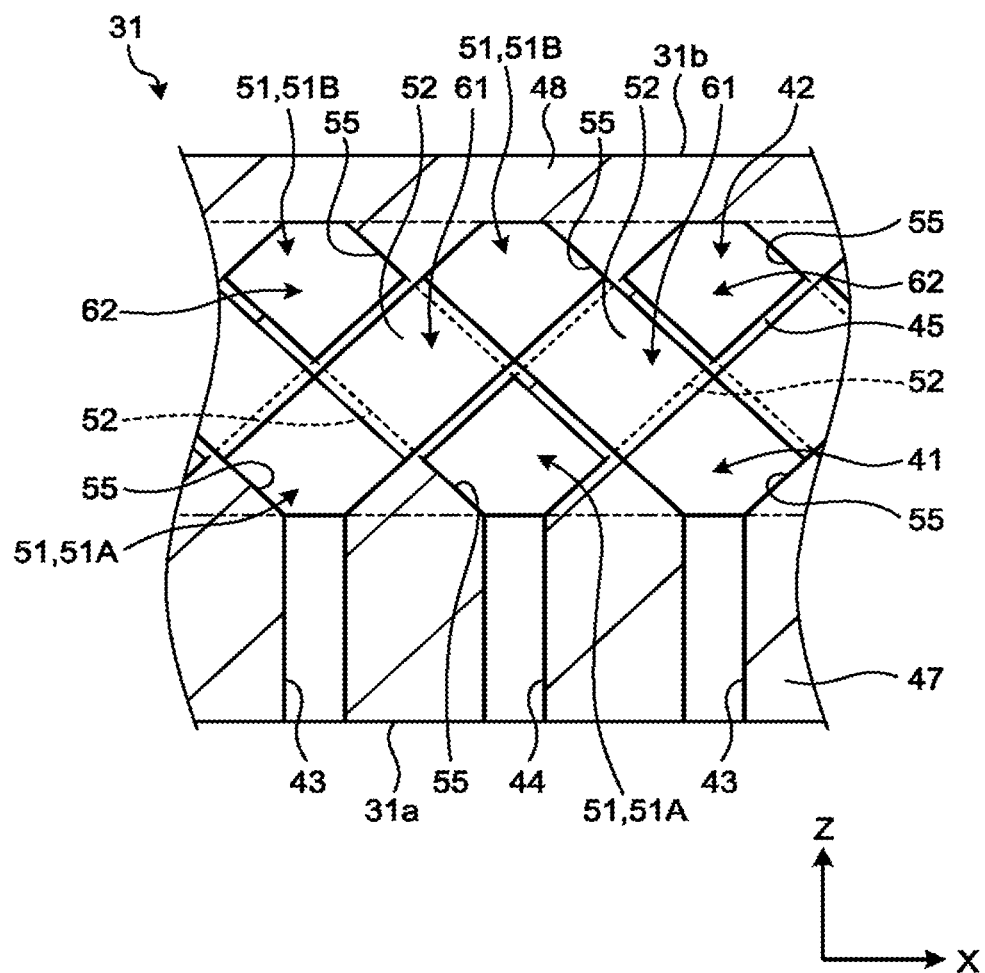
FIG. 3 is a cross-sectional view partially illustrating the diffusing unit according to the first embodiment.

FIG. 3 is a cross-sectional view partially illustrating the diffusing unit 31 according to the first embodiment. As illustrated in FIG. 3, the diffusing unit 31 includes a bottom wall 47 and an upper wall 48. In FIG. 3, the partition wall 45, the bottom wall 47, and the upper wall 48 are separated by a two-dot chain line.

The bottom wall 47 forms the bottom surface 31a of the diffusing unit 31. The upper wall 48 forms the upper surface 31b of the diffusing unit 31. The partition wall 45 is positioned between the bottom wall 47 and the upper wall 48. The first passage 41 and the second passage 42 are provided between the bottom wall 47 and the upper wall 48.

In the present embodiment, the shower plate 13 is additive manufactured, for example, by a 3D printer. Therefore, the shower plate 13 is molded as a single object. That is, the partition wall 45, the bottom wall 47, and the upper wall 48 are integrally molded. Note that the partition wall 45, the bottom wall 47, and the upper wall 48 may be molded individually.

The plurality of first openings 43 is provided in the bottom wall 47. Each of the first openings 43 is connected to the first passage 41 and is opened in the bottom surface 31a of the diffusing unit 31. The first openings 43 are arranged at equal intervals in a matrix shape in the direction along the X axis and the direction along the Y axis. Note that the arrangement of the plurality of first openings 43 is not limited thereto.

The plurality of second openings 44 is provided in the bottom wall 47. Each of the second openings 44 is connected to the second passage 42 and is opened in the bottom surface 31a of the diffusing unit 31. The second openings 44 are arranged at equal intervals in a matrix shape in the direction along the X axis and the direction along the Y axis. For example, in the direction along the X axis, the first openings 43 and the second openings 44 are alternately arranged. Note that the arrangement of the second openings 44 is not limited thereto.

Figure 4:
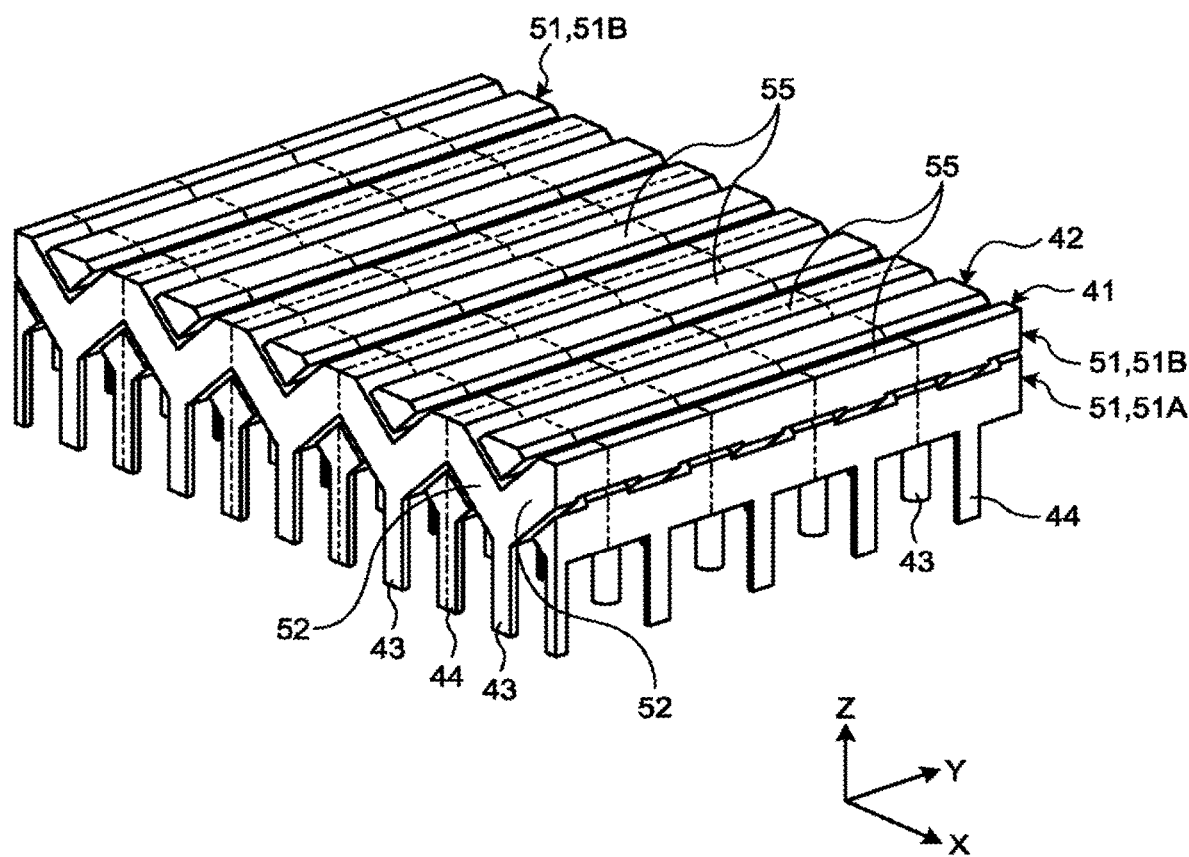
FIG. 4 is a perspective view partially illustrating first and second passages and first and second openings according to the first embodiment.

FIG. 4 is a perspective view partially illustrating the first and second passages 41 and 42 and the first and second openings 43 and 44 according to the first embodiment. In FIG. 4, the diffusing unit 31 is omitted, and the first and second passages 41 and 42 and the first and second openings 43 and 44 are illustrated. That is, FIG. 4 illustrates a space formed by the first and second passages 41 and 42 and the first and second openings 43 and 44.

As illustrated in FIG. 4, the first passage 41 and the second passage 42 each have two passage layers 51 and a plurality of connection passages 52. Each of the passage layers 51 may be also referred to as, for example, layer or assembly. A connection passage 52 may be also referred to as, for example, flow passage or connection portion.

The passage layer 51, as described later, is an assembly of a plurality of linear passages 55 arranged at substantially the same position in the direction along the Z axis. The two passage layers 51 are separately stacked in the direction along the Z axis. Note that part of one passage layer 51 and part of the other passage layer 51 may be located at the same position in the direction along the axis. The two passage layers 51 are connected by the connection passages 52.

The two passage layers 51 may be individually referred to as passage layers 51A and 51B, for description. The passage layer 51A adjoins the passage layer 51B and is nearer to the bottom surface 31a of the diffusing unit 31 than the passage layer 51B. The first passage 41 and the second passage 42 each includes the passage layers 51A and 51B.

Figure 5:
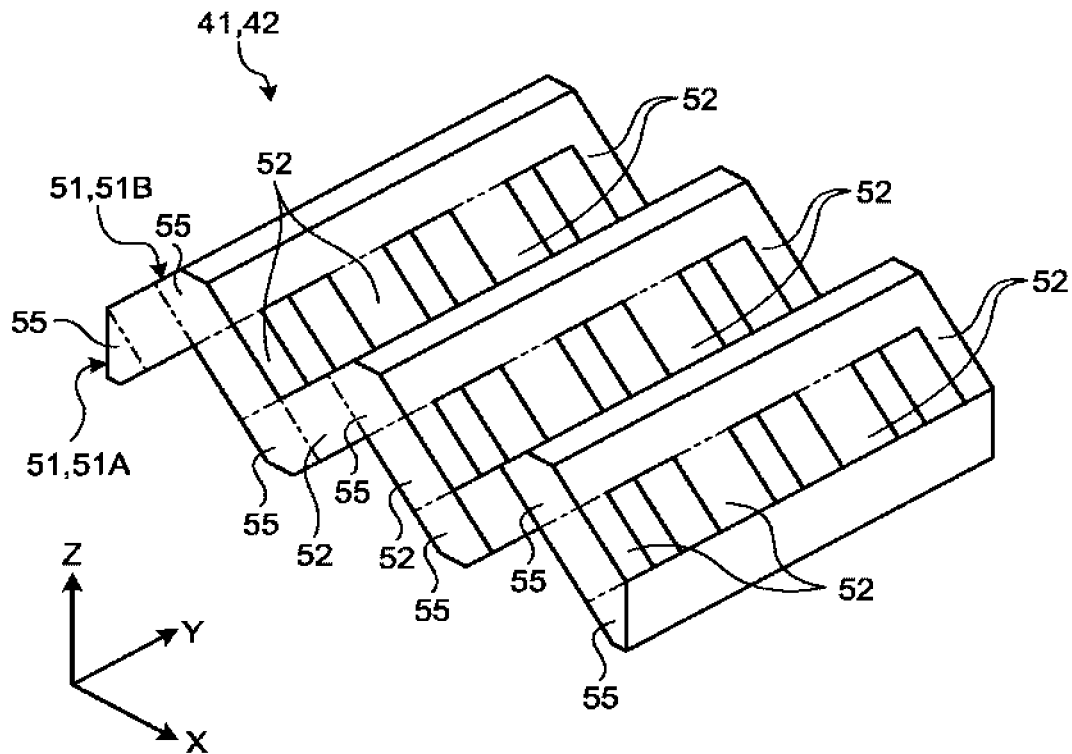
FIG. 5 is a schematic perspective view partially illustrating a passage layer and connection passages according to the first embodiment.

FIG. 5 is a schematic perspective view partially illustrating the passage layer 51 and the connection passages 52 according to the first embodiment. FIG. 5 illustrates the passage layer 51 and the connection passages 52 of the first passage 41 and the passage layer 51 and the connection passages 52 of the second passage 42 in common. Note that the shapes of the passage layer 51 and connection passage 52 of the first passage 41 may be different from the shapes of the passage layer 51 and connection passage 52 of the second passage 42.

Each of the passage layers 51 includes the plurality of linear passages 55. In the present embodiment, each of the linear passages 55 linearly extends. Note that the linear passage 55 may be curved or may have a curved portion. The linear passage 55 extends in one direction (longitudinal direction) as a whole.

The linear passages 55 included in each passage layer 51 extend in parallel. That is, the linear passages 55 included in the passage layer 51A extend in parallel. Furthermore, the linear passages 55 included in the passage layer 51B extend in parallel.

The linear passages 55 extending in parallel include a plurality of linear passages 55 extending substantially in the same direction. The linear passages 55 extending in parallel may be slightly different from each other in the longitudinal direction. The linear passages 55 extending in parallel are separately extend. In planar view in the direction along the Z axis in which the plurality of passage layers 51 is stacked, the linear passages 55 extending in parallel do not cross each other and are separated from each other.

In the first embodiment, each of the linear passages 55 has a substantially pentagonal cross-section and extends in the direction along the Y axis. That is, the plurality of linear passages 55 in the passage layer 51A and the plurality of linear passages 55 in the passage layer 51B extend in parallel in the same direction. Furthermore, a linear passage 55 of the first passage 41 and a linear passage 55 of the second passage 42 extend in parallel in the same direction. Note that the linear passage 55 may have another shape and may extend in another direction.

The linear passages 55 are aligned in the direction along the X axis. That is, in each passage layer 51, the linear passages 55 are spaced apart from each other in the direction (direction along the X axis) crossing the longitudinal direction (direction along the Y axis) of the linear passages 55 and crossing the direction (direction along the Z axis) in which the passage layers 51 are stacked. Note that the plurality of linear passages 55 may be aligned in another direction.

In each passage layer 51, a distance between adjacent linear passages 55 is larger than a length (width) of a linear passage 55 in the direction along the X axis Note that the distance between adjacent linear passages 55 is not limited thereto.

The plurality of linear passages 55 in the passage layer 51A and the plurality of linear passages 55 in the passage layer 51B are alternately arranged in the direction along the X axis. In other words, the linear passages 55 in the passage layer 51A and the linear passages 55 in the passage layer 51B are arranged in a staggered pattern.

The connection passages 52 connect linear passages 55 in the two adjacent passage layers 51 to each tether. That is, each of the connection passages 52 connects one linear passage 55 in the passage layer 51A and one linear passage 55 in the passage layer 51B to each other. Therefore, as illustrated in FIG. 3, in planar view in the direction along the Y axis, the connection passage 52 extends in the direction obliquely crossing the Z axis.

As illustrated in FIG. 5, the connection passages 52 are spaced apart from each other in the longitudinal directions of the linear passages 55 (direction along the Y axis). A distance between adjacent connection passages 52 is larger than a length (width) of the connection passage 52 in the direction along the Y axis.

As described above, the plurality of linear passages 55 in the passage layer 51A on the upper side and the plurality of linear passages 55 in the passage layer 51B on the lower side are alternately arranged in the direction along the X axis. Therefore, in the direction along the X axis, a linear passage 55 in the passage layer 51A on the lower side is positioned between two linear passages 55 in the passage layer 51B on the upper side. Connection passages 52 connect two linear passages 55 in the passage layer 51B on the upper side to a linear passage 55 in the passage layer 51A on the lower side, positioned between the two linear passages 55. As described above, each linear passage 55 in the passage layer 51A on the lower side is connected to corresponding two linear passages 55 in the passage layer 51B on the upper side through a plurality of connection passages 52. In other words, two linear passages 55 in the passage layer 51B on the upper side are connected to the same linear passage 55 in the passage layer 51A on the lower side. Furthermore, each linear passage 55 in the passage layer 51B is connected to corresponding two linear passages 55 in the passage layer 51A through a plurality of connection passages 52.

Two adjacent linear passages 55 in the passage layer 51A are connected to each other through one linear passage 55 in the passage layer 51B and two connection passages 52. Furthermore, two adjacent linear passages 55 in the passage layer 51B are connected to each other through one linear passage 55 in the passage layer 51A and two connection passages 52.

Figure 6:
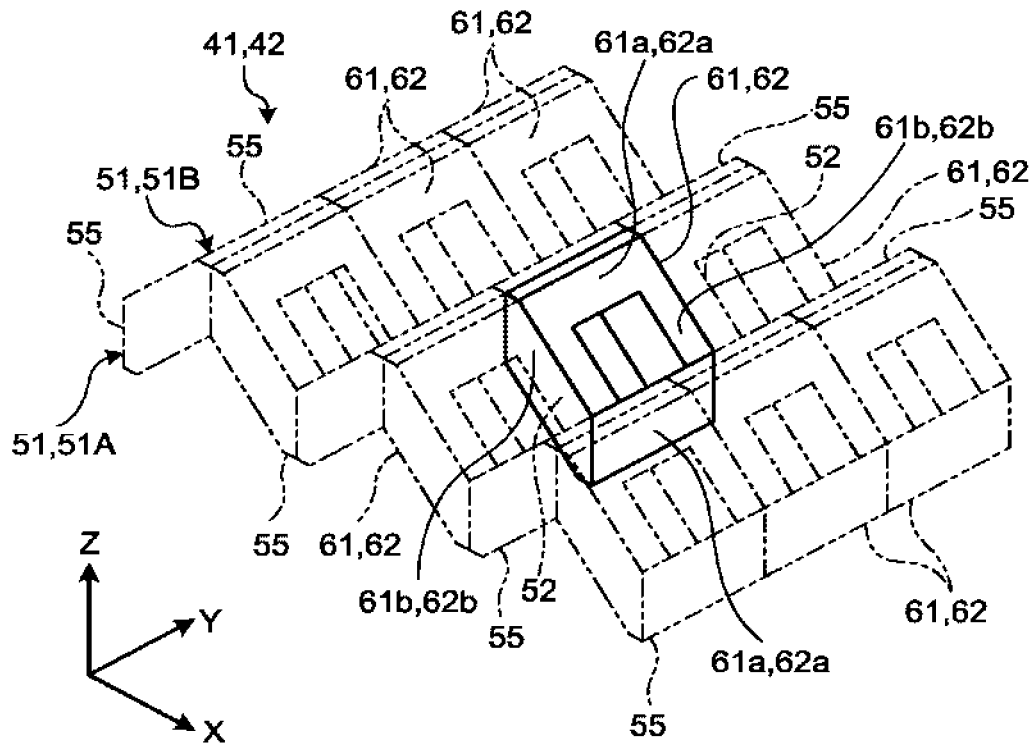
FIG. 6 is a schematic perspective view illustrating a plurality of sections obtained by partially dividing the first or second passages according to the first embodiment.

FIG. 6 is a schematic perspective view illustrating a plurality of sections obtained by partially dividing the first passage 41 or the second passage 42 according to the first embodiment. As in FIG. 5, FIG. 6 illustrates the passage layer 51 and the connection passages 52 of the first passage 41 and the passage layer 51 and the connection passages 52 of the second passage 42 in common.

As illustrated in FIG. 6, the first passage 41 includes a plurality of first closed path portions 61. In other words, it can be seen that the first passage 41 is divided into the plurality of first closed path portions 61. In FIG. 6, one first closed path portion 61 is indicated by a solid line, and the other first closed path portions 61 are indicated by a two-dot chain line. FIG. 6 illustrates an example of the first closed path portion 61, and a shape of the first closed path portion 61 is not limited to the shape of the first closed path portion 61 illustrated in FIG. 6.

Each of the first closed path portions 61 is part of the first passage 41, and is a portion as a passage whose starting point and ending point are the same and which allows a fluid to flow therein. In other words, the first closed path portion 61 is an annular portion in the first passage 41. The first closed path portion 61 may be, for example, an annular shape, or may be a square ring shape which may be also referred to as a frame shape. The first closed path portion 61 encloses a space so as to be surrounded by the first closed path portion 61. Note that the first closed path portion 61 is not limited thereto.

Each of the first closed path portions 61 according to the first embodiment includes two first extending portions 61a and two first connection portions 61b. The two first extending portions 61a each extend in the direction along the Y axis. The two first connection portions 61b each connect an end portion of one first extending portion 61a and an end portion of another first extending portion 61a.

The plurality of passage layers 51 of the first passage 41 and the plurality of connection passages 52 include the first closed bath portions 61 connected to each other. For example, the linear passage 55 in a passage layer 51 includes a plurality of first extending portions 61a connected to each other in the direction along the Y axis. The connection passage 52 includes the first connection portion 61b.

The second passage 42 includes a plurality of second closed path portions 62. In other words, it can be seen that the second passage 42 is divided into the plurality of second closed path portions 62. The shape of each second closed path portion 62 is not limited to the shape of the second closed path portion 62 illustrated in FIG. 6.

Each of the second closed path portions 62 is part of the second passage 42, and is a portion as a passage whose starting point and ending point are the same and which allows a fluid to flow therein. The second closed path portion 62 encloses a space so as to be surrounded by the second closed path portion 62. Mote that the second closed bath portions 62 are not limited thereto.

Each of the second closed path portions 62 according to the first embodiment includes two second extending portions 62a and two second connection portions 62b. The two second extending portions 62a each extend in the direction along the Y axis. The two second connection portions 62b each connect an end portion of one second extending portion 62a and an end portion of another second extending portion 62a.

The plurality of passage layers 51 of the second passage 42 and the plurality of connection passages 52 include the second closed path portions 62 connected to each other. For example, the linear passage 55 in a passage layer 51 includes a plurality of second extending portions 62a connected to each other in the direction along the Y axis. The connection passage 52 includes the second connection portion 62b.

As illustrated in FIG. 4, the linear passages 55 of the first passage 41 and the linear passages 55 of the second passage 42 are alternately arranged in the direction along the X axis. That is, in each of the passage layers 51, between two linear passages 55 of the first passage 41, one linear passage 55 of the second passage 4 is arranged. Furthermore, between two linear passages 55 of the second passage 42, one linear passage 55 of the first passage 41 is arranged.

In the direction along the Z axis, the plurality of linear passages 55 in the passage layer 51A of the first passage 41 is arranged at a position substantially the same as that of the plurality of linear passages 55 in the passage layer 51A of the second passage 42. Furthermore, in the direction along the Z axis, the plurality of linear passages 55 in the passage layer 51B of the first passage 41 is arranged at a position substantially the same as that of the plurality of linear passages 55 in the passage layer 51B of the second passage 42. Note that in the direction along the Z axis, the position of each linear passage 55 of the first passage 41 may be different from the position of each linear passage 55 of the second passage 42.

The first passage 41 and the second passage 42 form two layers separately stacked. These two layers each include the linear passages 55 of the first passage 41 and the linear passage 55 of the second passage 42 that are alternately arranged. That is, one layer and the other layer are stacked. The one layer includes the plurality of linear passages 55 in the passage layer 51A of the first passage 41 and the plurality of linear passages 55 in the passage layer 51A of the second passage 42, and the other layer includes the plurality of linear passages 55 in the passage layer 51B of the first passage 41 and the plurality of linear passages 55 in the passage layer 51B of the second passage 42.

The connection passages 52 of the first passage 41 and the connection passages 52 of the second passage 42 are alternately arranged in the direction along the Y axis. That is, one connection passage 52 of the second passage 42 is arranged between two connection passages 52 of the first passage 41. Furthermore, one connection passage 52 of the first passage 41 is arranged between two connection passages 52 of the second passage 42.

As illustrated in FIG. 3, the first closed path portions 61 pass through the second closed path portions 62 while being isolated from the second closed path portions 62. Furthermore, the second closed path portions 62 pass through the first closed path portions 61 while being isolated from the first closed path portions 61. The partition wall 45 isolates the first closed path portions 61 and the second closed path portions 62 from each other.

The first passage 41 and the second passage 42 have substantially geometrically the same shape. For example, the first passage 41 coincides with the second passage 42, when rotated about the Z axis. The first passage 41 has a volume substantially the same as the volume of the second passage 42. Note that the first passage 41 may have a shape different from the shape of the second passage 42.

The plurality of first openings 43 is connected to the linear passages 55 in the passage layer 51A of the first passage 41 Furthermore, the plurality of second openings 44 is connected to the linear passages 55 in the passage layer 51A of the second passage 42.

Figure 7:
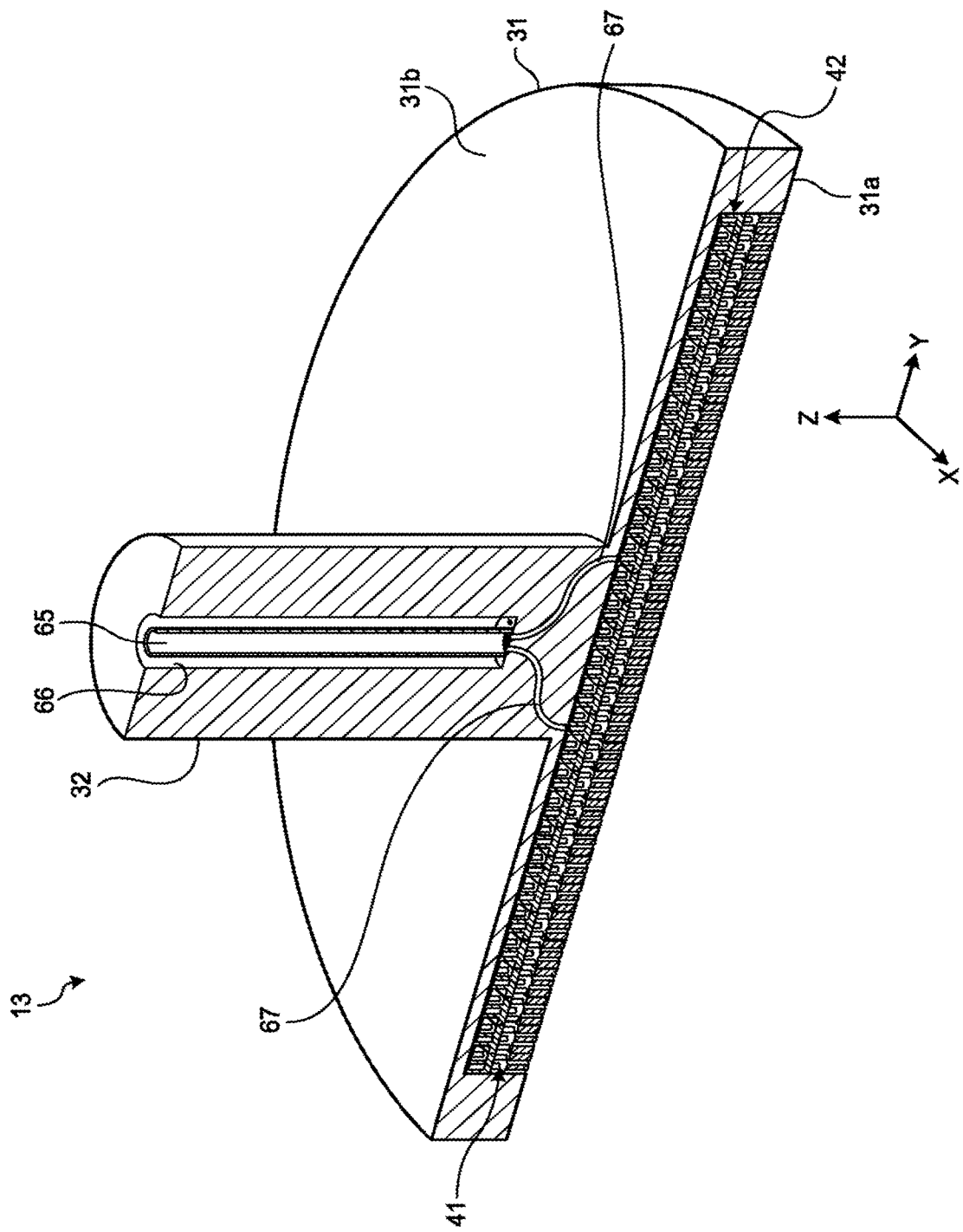
FIG. 7 is a perspective view illustrating a cross-section of a shower plate according to the first embodiment.
Figure 8:
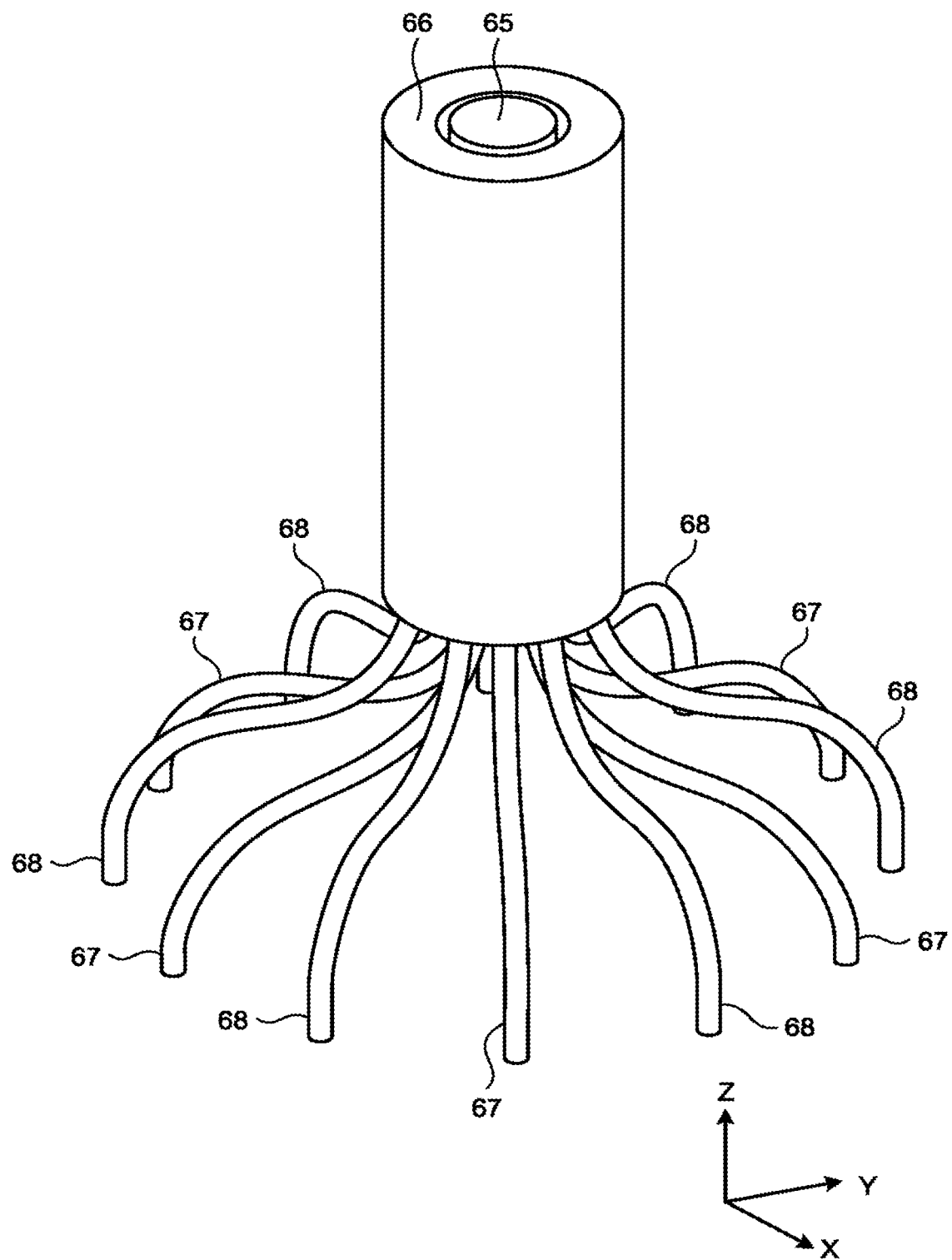
FIG. 8 is a perspective view illustrating first and second conduits, and a plurality of first and second distribution passages according to the first embodiment.

FIG. 7 is a perspective view illustrating a cross-section of the shower plate 13 according to the first embodiment. FIG. 8 is a perspective view illustrating a first conduit 65 and a second conduit 66, and a plurality of first distribution passages 67 and a plurality of second distribution passages 68 according to the first embodiment.

As illustrated in FIGS. 7 and 8, the shower plate 13 is provided with the first conduit 65, the second conduit 66, the plurality of first distribution passages 67 and the plurality of second distribution passages 68 (illustrated in FIG. 8). In FIG. 8, the tube portion 32 is omitted, and the first conduit 65, the second conduit 66, the plurality of first distribution passages 67, and the plurality of second distribution passages 68 are illustrated. That is, FIG. 8 illustrates a space formed by the first conduit 65, the second conduit 66, the plurality of first distribution passages 67, and the plurality of second distribution passages 68.

The first conduit 65 and the second conduit 66 are provided in the tube portion 32 and extend in the direction along the Z axis. The second conduit 66 has an annular cross-section. The first conduit 65 is positioned in the second conduit 66. That is, the first conduit 65 and the second conduit 66 form a so-called double tube.

One end portion of the first conduit 65 opens at an upper end portion of the tube portion 32. The other end portion of the first conduit 65 is connected to the first passage 41 through the plurality of first distribution passages 67. The plurality of first distribution passages 67 connects the first conduit 65 to the plurality of linear passages 55 in the passage layer 51B of the first passage 41. The plurality of first distribution passages 67 has equal conductance. Note that the respective first distribution passages 67 may have different shapes.

One end portion of the second conduit 66 opens at the upper end portion of the tube portion 32. The other end portion of the second conduit 66 is connected to the second passage 42 through the plurality of second distribution passages 68. The plurality of second distribution passages 68 connects the second conduit 66 to the plurality of linear passages 55 in the passage layer 51B of the second passage 42. The plurality of second distribution passages 68 has equal conductance. Note that the respective second distribution passages 66 may have different shapes.

As illustrated in FIG. 1, the first pump 14 is connected to the tube portion 32 of the shower plate 13, for example, through piping. The first pump 14 feeds a first gas G1 to the first passage 41 through the first conduit 65 and the plurality of first distribution passages 67 illustrated in FIG. 8. The first gas G1 is an example of a first fluid. The first fluid is not limited to gas and may be, for example, liquid.

The first gas G1 fed from the first pump 14 to the first conduit 65 is fed to the plurality of linear passages 55 in the passage layer 51B of the first passage 41 through the plurality of first distribution passages 67. Since the plurality of first distribution passages 67 has the equal conductance, an equal amount of first gas G1 is fed to each of the plurality of linear passages 55. The first gas G1 diffuses in the first passage 41 illustrated in FIG. 2.

For example, the first gas G1 flows in the linear passages 55 in the passage layer 51B in the direction along the Y axis and moves to the linear passages 55 in the passage layer 51A through the connection passages 52. The first gas G1 flows in the linear passages 55 in the passage layer 51A and moves to the linear passages 55 in the passage layer 51B through the connection passages 52. As described above, the first gas G1 diffuses in both of the passage layer 51A and the passage layer 51B and is filled in the first passage 41.

A cross-sectional area of a first opening 43 viewed in the direction along the Z axis is smaller than a cross-sectional area of a linear passage 55 of the first passage 41 viewed in the direction along the Y axis, and is smaller than a cross-sectional area of a connection passage 52 of the first passage 41 viewed in the direction in which the connection passage 52 extends. Therefore, a pressure loss of the first gas G1 flowing in the first passage 41 is smaller than a pressure loss of the first gas G1 passing through a first opening 43. Therefore, the first gas G1 easily diffuses in the first passage 41 rather than flowing into the first opening 43.

The first gas G1 diffusing in the first passage 41 is discharged from the plurality of first openings 43 to the wafer W supported on the stage 12. FIG. 1 schematically illustrates the first gas G1 discharged from the first openings 43, which is indicated by thin arrows.

The second pump 15 is connected to the tube portion 32 of the shower plate 13, for example, through piping. The second pump 15 feeds a second gas G2 to the second passage 42 through the second conduit 66 and the second distribution passages 68 illustrated in FIG. 8. The second gas G2 is an example of a second fluid. The second fluid is not limited to gas and may be, for example, liquid.

The second gas G2 fed from the second pump 15 to the second conduit 66 is fed to the plurality of linear passages 55 in the passage layer 51B of the second passage 42 through the plurality of second distribution passages 68. Since the plurality of second distribution passages 68 has the equal conductance, an equal amount of the second gas G2 is fed to each of the plurality of linear passages 55. As in the first gas G1, the second gas G2 diffuses in both of the passage layer 51A and the passage layer 51B of the second passage 42 and is filled in the second passage 42.

A cross-sectional area of a second opening 44 viewed in the direction along the Z axis is smaller than a cross-sectional area of a linear passage 55 of the second passage 42 viewed in the direction along the Y axis, and is smaller than a cross-sectional area of a connection passage 52 of the second passage 42 viewed in the direction in which the connection passage 52 extends. Therefore, a pressure loss of the second gas G2 flowing in the second passage 42 is smaller than a pressure loss of the second gas G2 passing through a second opening 44. Therefore, the second gas G2 easily diffuses in the second passage 42 rather than flowing into the second opening 44.

The second gas G2 diffusing in the second passage 42 is discharged from the plurality of second openings 44 to the wafer W supported on the stage 12. FIG. 1 schematically illustrates the second gas G2 discharged from the second openings 44, which is indicated by two-dot chain arrows.

The first gas G1 is, for example, methylsilane. The second gas G2 is, for example, hydrogen peroxide. The first gas G1 and the second gas G2 discharged from the shower plate 13 forms a silicon dioxide film on the wafer N by chemical reaction. Note that the first gas G1 and the second gas G2 may be another fluid. Furthermore, the first gas G1 and the second gas G2 may be a fluid having the same composition. Note that the first gas G1 and the second gas G2 may be fed, for example, from a side of the shower plate 13 to the first passage 41 and the second passage 42 without passing through the first and second conduits 65 and 66.

In the semiconductor manufacturing apparatus 10 according to the first embodiment described above, the first passage 41 includes the plurality of first closed path portions 61 connected to each other. The second passage 42 includes the plurality of second closed path portions 62 connected to each other. For example, the first gas G1 fed to the first passage 41 can be discharged outside the shower plate 13 through the plurality of first openings 43. The second gas G2 fed to the second passage 42 can be discharged outside the shower plate 13 through the plurality of second openings 44 without being mixed with the first gas G1. As described above, one shower plate 13 can feed a plurality of kinds of gases G1 and G2 individually. Furthermore, the gas G1 or G2 can flow so as to circulate in the first closed path portions 61 or the second closed path portions 62 and readily diffuses in the first passage 41 or the second passage 42. Accordingly, the shower plate 13 can discharge the gas G1 or G2 more uniformly from the plurality of first openings 43 or the plurality of second openings 44.

Furthermore, the first closed path portions 61 pass through the corresponding second closed path portions 62 while being isolated from the second closed path portions 62, and the second closed path portions 62 pass through the corresponding first closed path portions 61 while being isolated from the first closed path portions 61. Thus, the first closed path portions 61 and the second closed path portions 62 are arranged at substantially the same positions so that the shower plate 13 can be reduced in size and thickness.

The first passage 41 and the second passage 42 each include the plurality of passage layers 51 each including the plurality of linear passages 55 aligned, and the plurality of connection passages 52 connecting the linear passages 55 in the two adjacent passage layers 51 to each other. The linear passages 55 of the first passage 41 and the linear passages 55 of the second passage 42 are arranged alternately. Thus, the first passage 41 and the second passage 42 can have substantially geometrically the same shape. Furthermore, each of the first openings 43 and the second openings 44 can also have substantially the same length. Furthermore, the first openings 43 and the second openings 44 can be further equally spaced in the bottom surface 31a. Accordingly, the pressure loss of the first gas 51 passing through the first passage 41 and the pressure loss of the second gas 52 passing through the second passage 42 can be substantially the same.

Furthermore, the linear passage 55 in each passage layer 51 is connected to two corresponding linear passages 55 in the different passage layer 51 adjacent to the passage layer 51 through connection passages 52. That is, two adjacent linear passages 55 in each passage layer 51 are connected through an adjacent linear passage 55 in the different passage layer 51. Accordingly, the gas G1 or G2 can diffuse in the first passage 41 or the second passage 42.

The plurality of linear passages 55 of the first passage 41 and the second passage 42 extend in parallel. Thus, the first passage 41 and the second passage 42 can have substantially geometrically the same shape. Accordingly, the pressure loss of the first gas G1 passing through the first passage 41 and the pressure loss of the second gas G2 passing through the second passage 42 can be calculated more readily.

The plurality of first distribution passages 67 connects be first conduit 65 to the first passage 41. The plurality of second distribution passages 68 connects the second conduit 66 to the second passage 42. Thus, the gas G1 or G2 can be fed from a plurality of positions to the first passage 41 or the second passage 42. That is, when the gas G1 or G2 is fed to the first passage 41 or the second passage 42, the gas G1 or G2 already diffuses to some extent. Accordingly, the shower plate 13 can discharge the gas G1 or G2 more uniformly from the plurality of first openings 43 or the plurality of second openings 44.

Hereinafter, a second embodiment will be described with reference to FIG. 9. Note that, in the following description of a plurality of embodiments, component elements having similar functions to those of the component elements having been described above are denoted by the same reference signs as those of the component elements having been described above and the description thereof may be further omitted. Furthermore, all of the functions and properties of the plurality of component elements denoted by the same reference signs are not always in common, and the plurality of component elements may have different functions and properties according to the respective embodiments.

Figure 9:
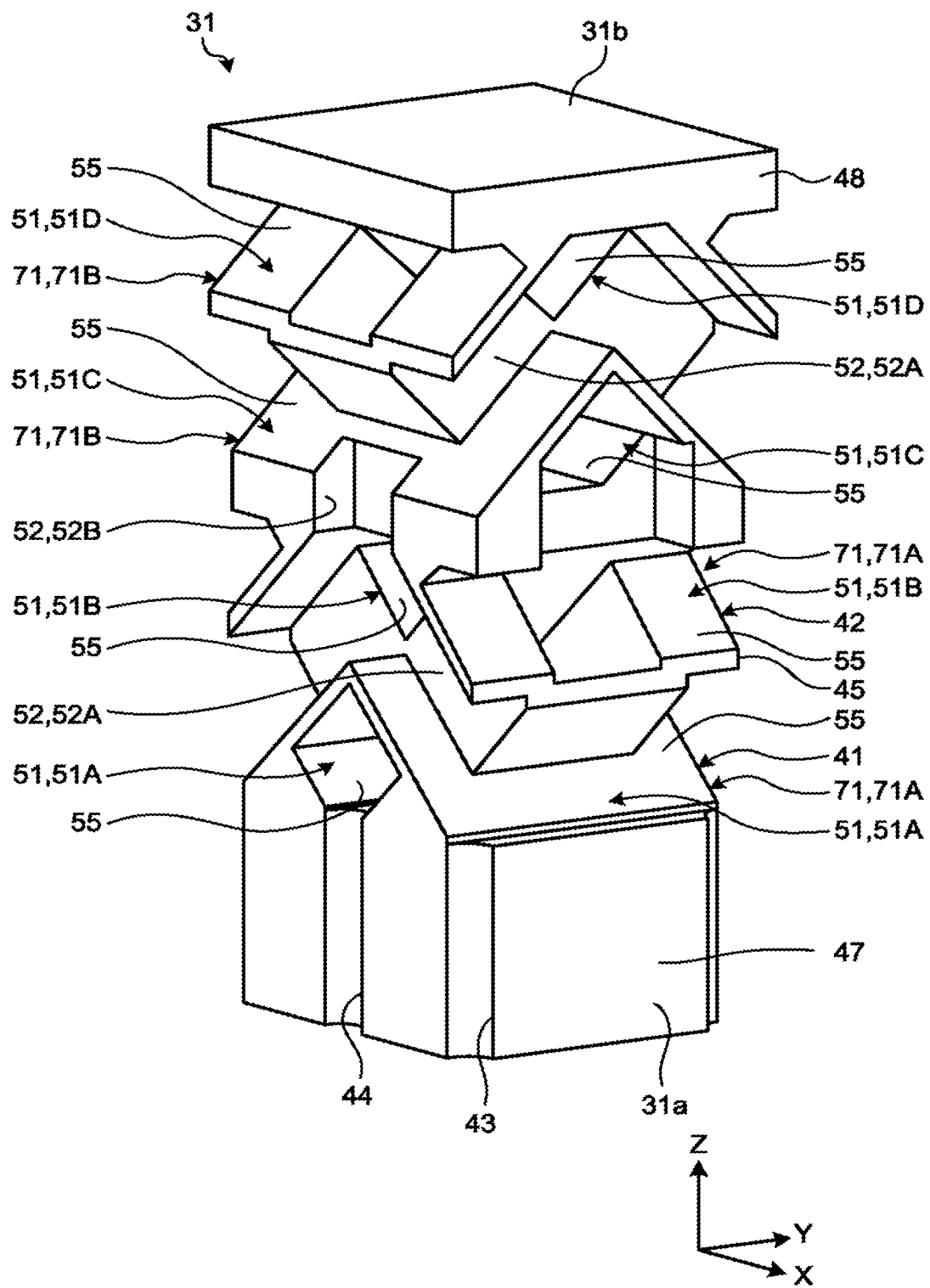
FIG. 9 is a perspective view partially illustrating a diffusing unit according to a second embodiment.

FIG. 9 is a perspective view partially illustrating the diffusing unit 31 according to the second embodiment. As illustrated in FIG. 9, the first passage 41 and the second passage 42 according to the second embodiment each includes four passage layers 51 and plurality of connection passages 52. The four passage layers 51 are separated from each other and stacked in the direction along the Z axis.

The four passage layers 51 may be individually referred to as passage layers 51A, 51B, 51C, and 51D, for description. Of the passage layers 51A, 51B, 51C, and 51D, the passage layer 51A is nearest to the bottom surface 31a of the diffusing unit 31. The passage layer 51B is positioned between the passage layer 51A and the passage layer 51C. The passage layer 51C is positioned between the passage layer 51B and the passage layer 51B.

The first passage 41 and the second passage 42 each includes two layers 71. The two layers 71 each includes a plurality of adjacent passage layers 51. The two layers 71 are separated from each other and stacked in the direction along the Z axis.

The two layers 71 may be individually referred to as layers 71A and 71B, for description. The layer 71A includes two passage layers 51A and 51B. The layer 71B adjoins the layer 71A and includes two passage layers 51C and 51D. The layer 71B is separated farther from the bottom surface 31a of the diffusing unit 31 than the layer 71A.

The passage layers 51A and 51B of the layer 71A each includes a plurality of linear passages 55 which extend in parallel in the direction along the Y axis. In contrast, the passage layers 51C and 51D of the layer 71B include a plurality of linear passages 55 which extend in parallel in the direction along the X axis. Therefore, the longitudinal direction of the plurality of linear passages 55 in the layer 71A crosses the longitudinal direction of the plurality of linear passages 55 in the layer 71B, in planar view in the direction along the Z axis. In other words, the longitudinal direction of the plurality of linear passages 55 in the layer 71A and the longitudinal direction of the plurality of linear passages 55 in the layer 71B are skewed relative to each other.

In each passage layer 51, the linear passages 55 are spaced apart from each other in the direction crossing the longitudinal directions of the linear passages 55 and crossing the direction in which the passage layers 51 are stacked. Note that the plurality of linear passages 55 may be aligned in another direction.

The layers 71A and 71B have substantially geometrically the same shape. For example, when the layer 71A is rotated about the Z axis, the layer 71A coincides with the layer 71B. The layer 71A has a volume substantially the same as the volume of the layer 71B. Note that the layer 71A may have a shape different from the shape of the layer 71B. Furthermore, as in the first embodiment, the first passage 41 and the second passage 42 have substantially geometrically the same shape.

The plurality of connection passages 52 includes a plurality of connection passages 52A and a plurality of connection passages 52B. The plurality of connection passages 52A connects linear passages 55 in two adjacent passage layers 51 of each layer 71 to each other.

For example, one connection passage 52A connects a linear passage 55 in the passage layer 51A to a linear passage 55 in the passage layer 51B. Another connection passage 52A connects a linear passage 55 in the passage layer 51C to a linear passage 55 in the passage layer 51D. In planar view in the direction along the Y axis or the direction along the X axis, the connection passage 52A extends in the direction obliquely crossing the Z axis.

The plurality of connection passages 52B connects the layers 71A and 71B. That is, the plurality of connection passages 52B connects the linear passages 55 in the passage layer 51B to the linear passages 55 in the passage layer 51C.

In the semiconductor manufacturing apparatus 10 according to the second embodiment described above, the longitudinal direction of the plurality of linear passages 55 in one layer 71A crosses the longitudinal direction of the linear passages 55 of another layer 71B adjacent to the layer 71A, in planar view in the direction in which the passage layers 51 are stacked. For example, when the gas G1 or G2 flowing in the linear passages 55 in the layer 71B in the direction along the X axis moves to the linear passages 55 in the layer 71A, the speed of the gas G1 or G2 in the direction along the X axis is reduced. Thus, the first gas G1 and the second gas G2 readily diffuse in the first passage 41 or the second passage 42. Accordingly, the shower plate 13 can discharge the gas G1 or G2 more uniformly from a plurality of first openings 43 or a plurality of second openings 44.

Figure 10:
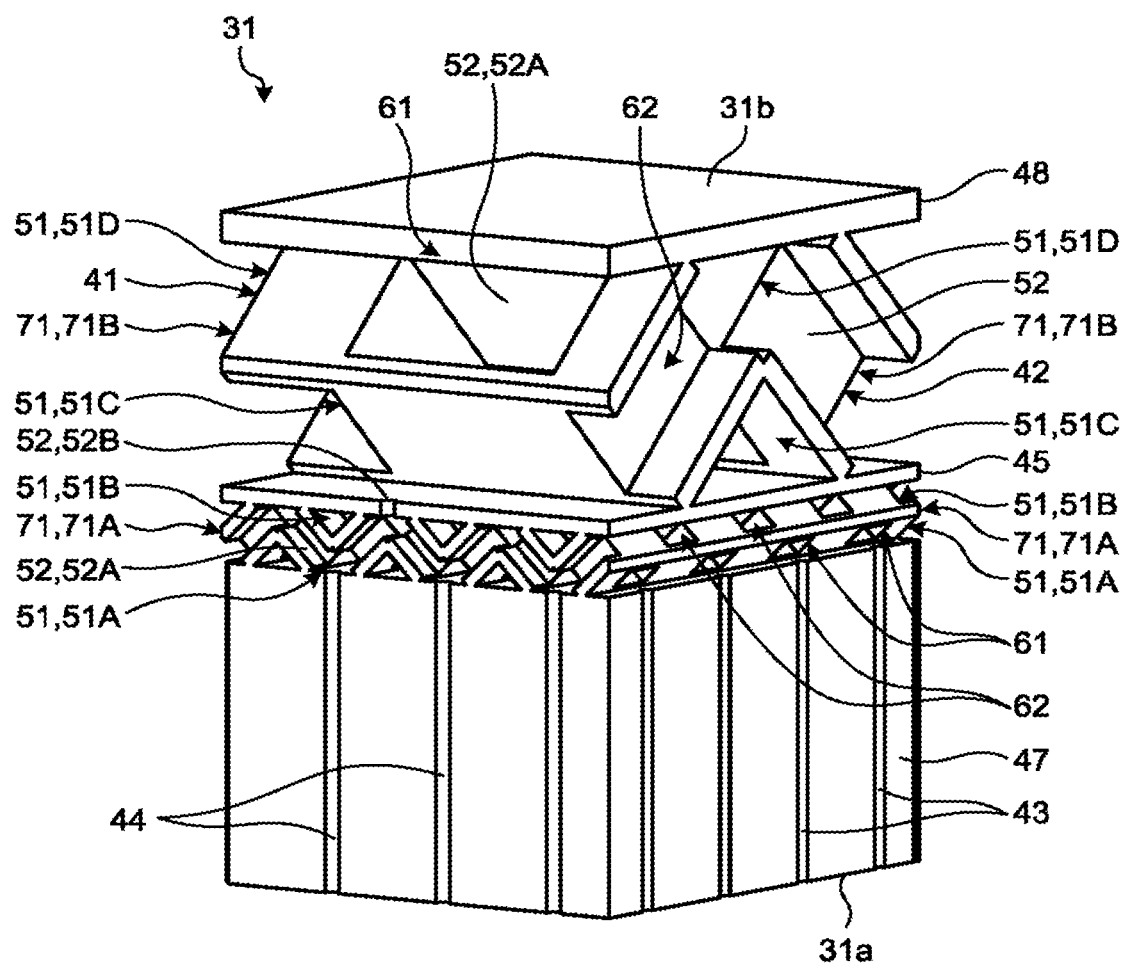
FIG. 10 is a perspective view partially illustrating a diffusing unit according to a third embodiment.

Hereinafter, a third embodiment will be described with reference to FIG. 10. FIG. 10 is a perspective view partially illustrating the diffusing unit 31 according to the third embodiment. In the first passage 41, the plurality of passage layers 51 and the plurality of connection passages 52 in the layer 71A include a plurality of first closed path portions 61 connected to each other. Furthermore, the plurality of passage layers 51 and the plurality of connection passages 52 in the layer 71B include a plurality of first closed path portions 61 connected to each other.

The first closed path portion 61 included in the layer 71A and the first closed path portion 61 included in the layer 71B have a geometrically similar shape. Note that the shape of the first closed path portion 61 included in the layer 71A may be different from the shape of the first closed path portion 61 included in the layer 71B. The first closed path portion 61 included in the layer 71A is smaller than the first closed path portion 61 included in the layer 71B.

The number of the first closed path portions 61 included in the layer 71A is larger than the number of the first closed path portions 61 included in the layer 71B. Therefore, the number of the linear passages 55 included in the layer 71A is larger than the number of the linear passages 55 included in the layer 71B. Furthermore, the number of the first openings 43 is larger than the number of the connection passages 52B in the first passage 11. For example, the number of the first openings 43 is 16 times the number of the connection passages 52B. Similarly, the number of the second openings 44 is larger than the number of the connection passages 52B in the second passage 42. For example, the number of the second openings 44 is 16 times the number of the connection passages 52B.

In the second passage 42, the plurality of passage layers 51 and the plurality of connection passages 52 in the layer 71A include a plurality of second closed path portions 62 connected to each other. Furthermore, the plurality of passage layers 51 and the plurality of connection passages 52 in the layer 71B also include a plurality of second closed path portions 62 connected to each other.

The second closed path portion 62 included in the layer 71A and the second closed path portion 62 included in the layer 71B have a geometrically similar shape. Note that the shape of the second closed path portion 62 included in the layer 71A may be different from the shape of the second closed path portion 62 included in the layer 71B. The second closed path portion 62 included in the layer 71A is smaller than the second closed path portion 62 included in the layer 71B.

The number of the second closed path portions 62 included in the layer 71A is larger than the number of the second closed path portions 62 included in the layer 71B. Therefore, the number of the linear passages 55 included in the layer 71A is larger than the number of the linear passages 55 included in the layer 71B. Furthermore, the number of the first openings 43 is larger than the number of the connection passages 52B.

As in the first embodiment, the first passage 41 and the second passage 42 have substantially geometrically the same shape. Furthermore, as in the second embodiment, the layers 71A and 71B have substantially geometrically the same shape.

In the semiconductor manufacturing apparatus 10 according to the third embodiment described above, the number of the first closed path portions 61 included in one layer 71A is larger than the number of the first closed path portions 61 included in the different layer 71B separated farther from the bottom surface 31a than the layer 71A. The number of the second closed path portions 62 included in one layer 71A is larger than the number of the second closed path portions 62 included in the different layer 71B separated farther from the bottom surface 31a than the layer 71A. Thus, the numbers of the first openings 43 and the second openings 44 can be set larger.

Furthermore, each of the second closed path portions 62 included in the layer 71A is smaller than each of the second closed path portions 62 included in the layer 71B. Therefore, a pressure loss of the gas G1 or G2 flowing in the layer 71B is smaller than a pressure loss of the gas G1 or G2 passing through the layer 71A. The gas G1 or G2 diffuses in the layer 71B, which is larger in width, and moves to the layer 71A, and the gas G1 or G2 is discharged from the first openings 43 or the second openings 44 connected to the layer 71A. Accordingly, the shower plate 13 can discharge the gas G1 or G2 more uniformly from the plurality of first openings 43 or the plurality of second openings 44.

Figure 11:
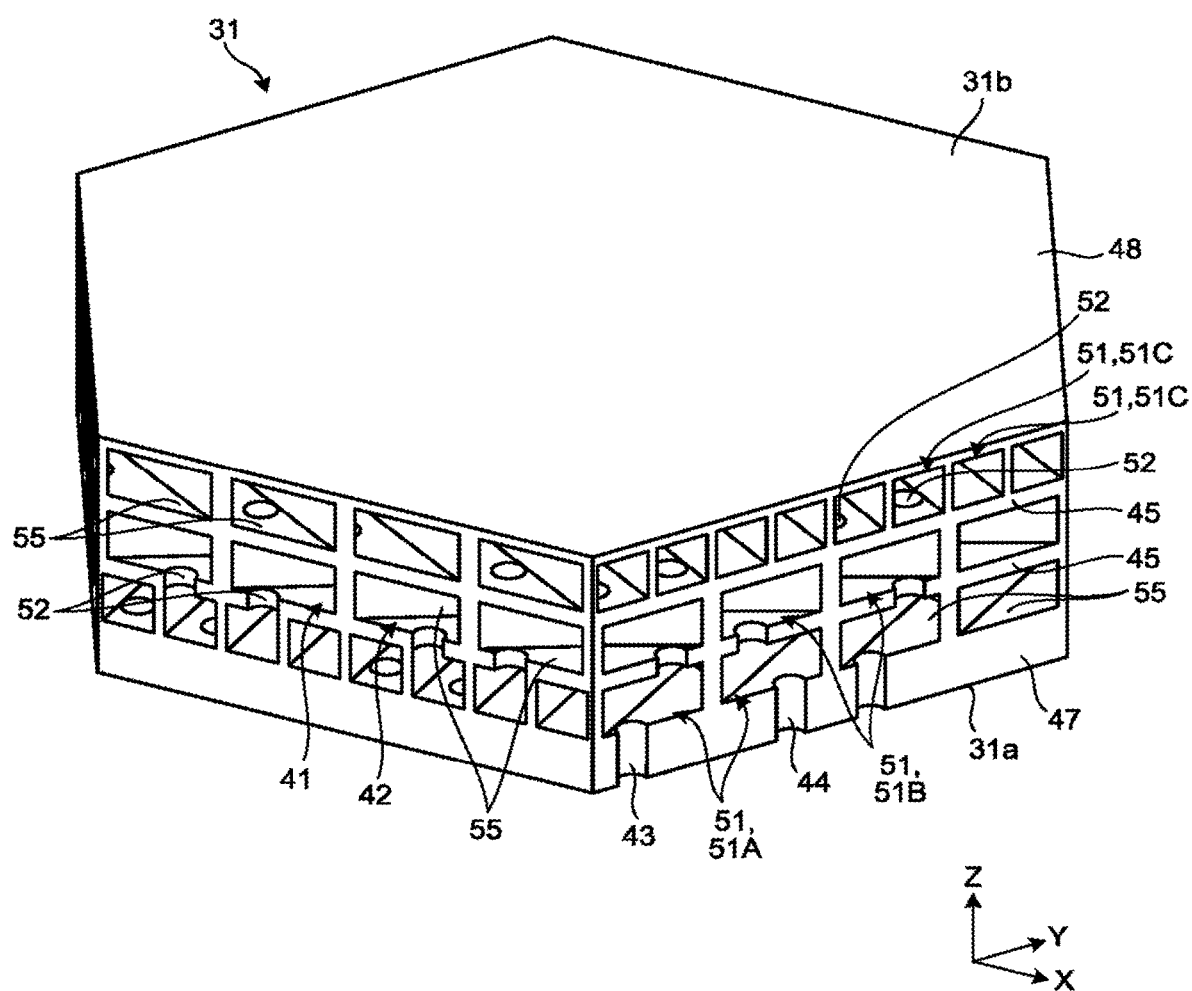
FIG. 11 is a perspective view partially illustrating a diffusing unit according to a fourth embodiment.

Hereinafter, a fourth embodiment will be described with reference to FIGS. 11 to 16. FIG. 11 is a perspective view partially illustrating the diffusing unit 31 according to the fourth embodiment. As illustrated in FIG. 11, the first passage 41 and the second passage 42 each includes three passage layers 51 and a plurality of connection passages 52. The three passage layers 51 may be individually referred to as passage layers 51A, 51B, and 51C, for description.

Figure 12:
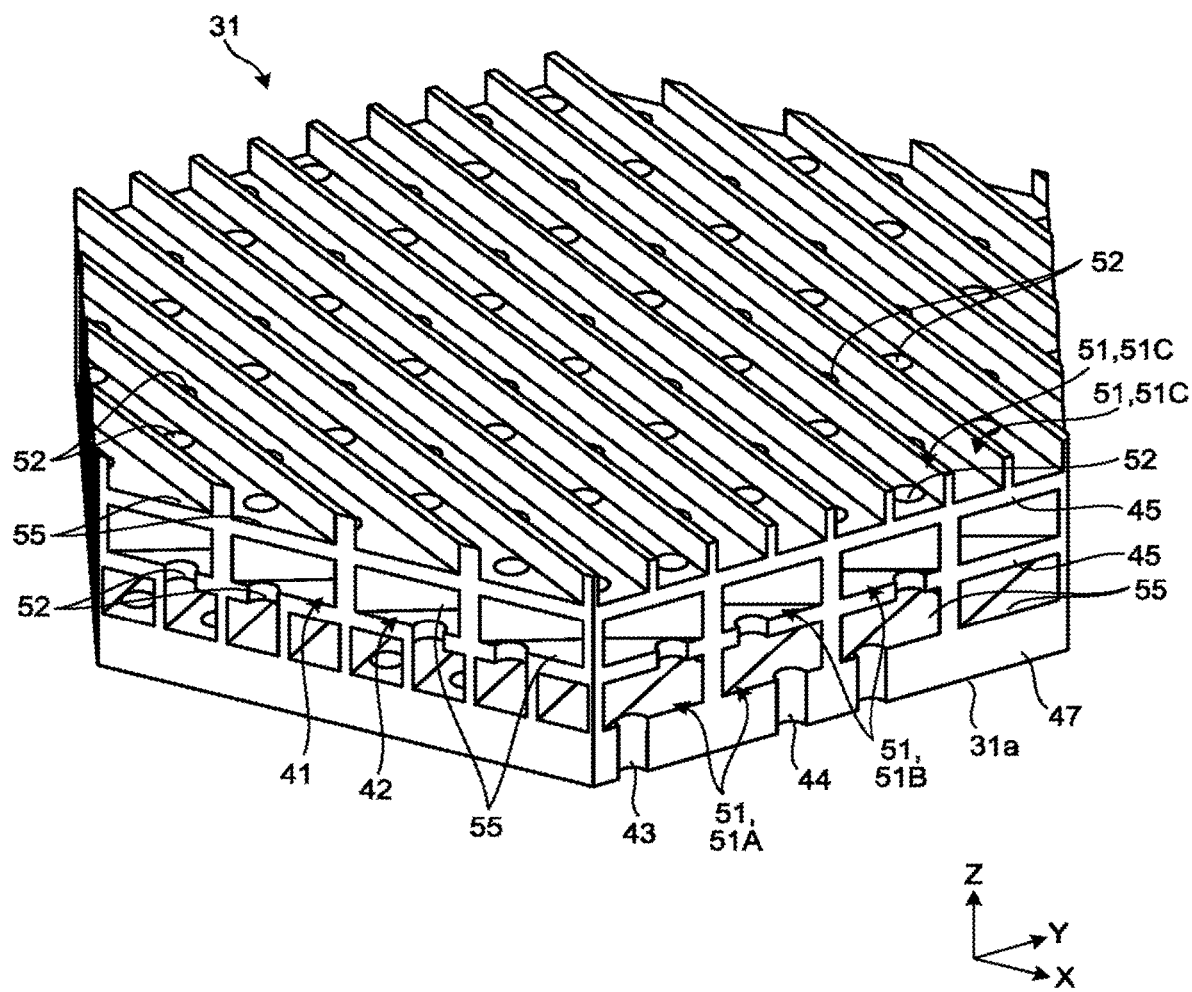
FIG. 12 is a perspective view illustrating one passage layer in which the diffusing unit according to the fourth embodiment is partially omitted.
Figure 13:
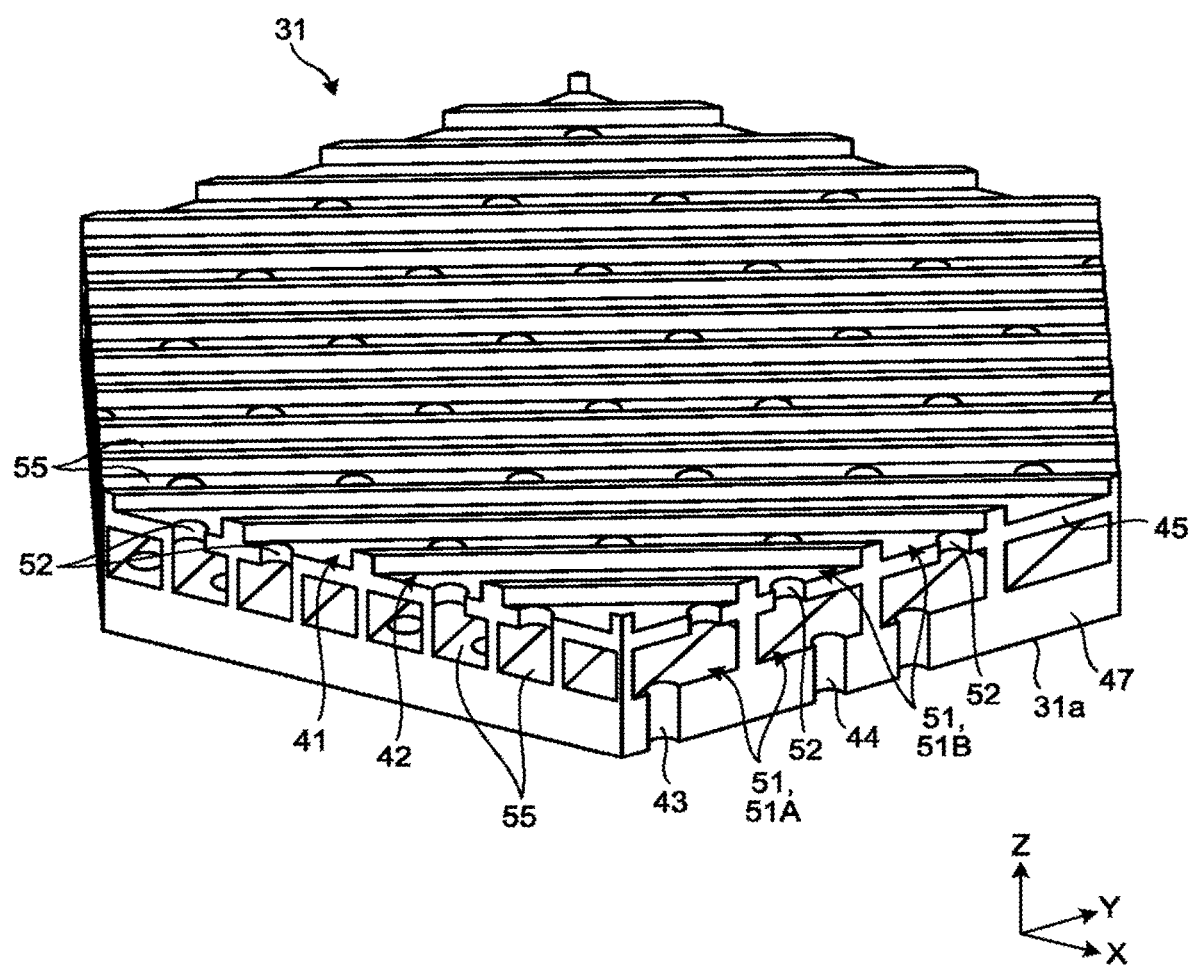
FIG. 13 is a perspective view illustrating another passage layer in which the diffusing unit according to the fourth embodiment is partially omitted.
Figure 14:
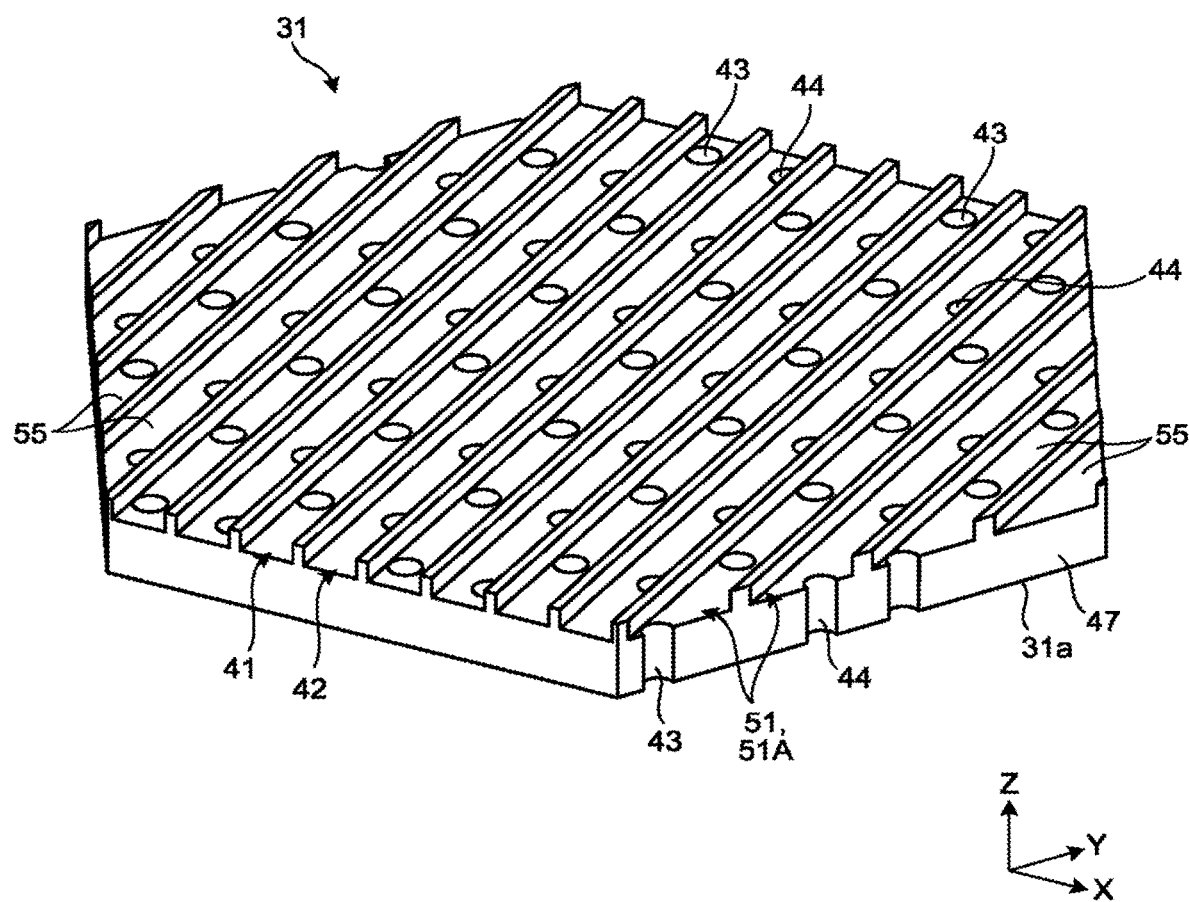
FIG. 14 is a perspective view illustrating still another passage layer in which the diffusing unit according to the fourth embodiment is partially omitted.

FIG. 12 is a perspective view illustrating the passage layer 51C in which the diffusing unit 31 according to the fourth embodiment is partially omitted. FIG. 13 is a perspective view illustrating the passage layer 51B in which the diffusing unit 31 according to the fourth embodiment is partially omitted. FIG. 14 is a perspective view illustrating the passage layer 51A in which the diffusing unit 31 according to the fourth embodiment is partially omitted. Of the passage layers 51A, 51B, and 51C, the passage layer 51A is nearest to the bottom surface 31a of the diffusing unit 31. The passage layer 51B is positioned between the passage layer 51A and the passage layer 51C.

Figure 15:
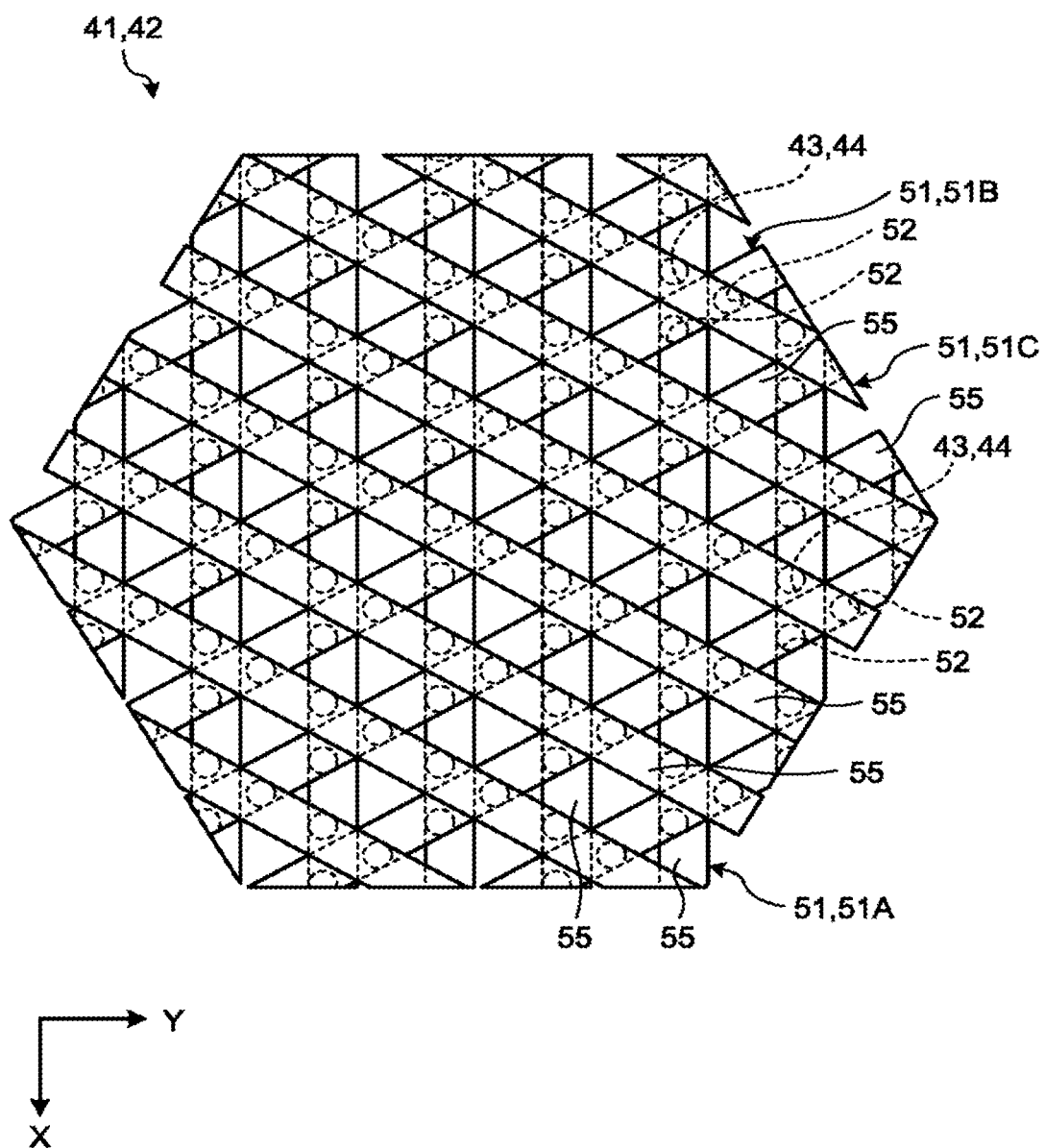
FIG. 15 is a schematic plan view partially illustrating passage layers and connection passages of first or second passages according to the fourth embodiment.
Figure 16:
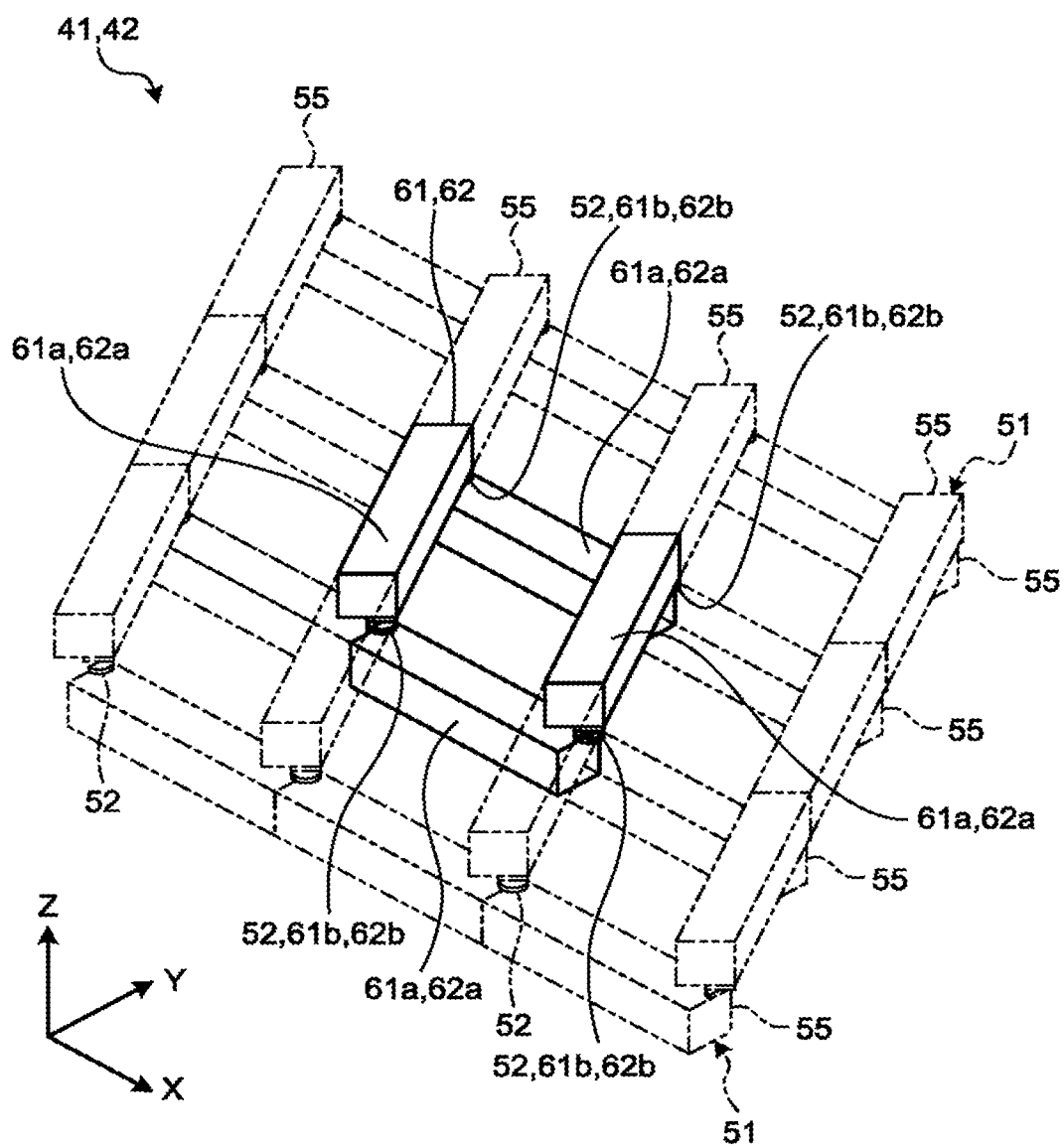
FIG. 16 is a schematic perspective view illustrating a plurality of sections obtained by partially dividing the first or second passages according to the fourth embodiment.

FIG. 15 is a schematic plan view partially illustrating a passage layer 51 and connection passages 52 of the first passage 41 or second passage 42 according to the fourth embodiment. FIG. 16 is a schematic perspective view illustrating a plurality of sections obtained by partially dividing the first passage 41 or second passage 42 according to the fourth embodiment.

FIGS. 15 and 16 illustrate the passage layer 51 and the connection passages 52 of the first passage 41 and the passage layer 51 and the connection passages 52 of the second passage 42, in common. Note that the shapes of the passage layer 51 and connection passage 52 of the first passage 41 may be different from the shapes of the passage layer 51 and connection passage 52 of the second passage 42.

The passage layer 51A includes a plurality of linear passages 55 which extends in parallel in the direction along the X axis. The passage layer 51B includes a plurality of linear passages 55 which extends in parallel on an X-Y plane in the direction inclined 60 degrees relative to the X axis.

The longitudinal direction of the plurality of linear passages 55 in the passage layer 51A and the longitudinal direction of the plurality of linear passages 55 in the passage layer 51B cross each other at 60 degrees in planar view in the direction along the axis. The angle of 60 degrees is an example of an angle which is a multiple of an angle obtained by dividing 180 degrees by the number of passage layers 51 and is smaller than 180 degrees. In other words, the longitudinal direction of the plurality of linear passages 55 in the passage layer 51A and the longitudinal direction of the plurality of linear passages 55 in the passage layer 51B are skewed 60 degrees. Note that the longitudinal direction of the plurality of linear passages 55 in the passage layer 51A and the longitudinal direction of the plurality of linear passages 55 in the passage layer 51B may cross each other at 120 degrees when viewed in the direction along the Z axis.

The passage layer 51C includes a plurality of linear passages 55 which extends in parallel on an X-Y plane in the direction inclined 120 degrees relative to the X axis. Therefore, the longitudinal direction of the plurality of linear passages 55 in the passage layer 51B and the longitudinal direction of the plurality of linear passages 55 in the passage layer 51C cross each other at 60 degrees in planar view in the direction along the Z axis. In other words, the longitudinal direction of the plurality of linear passages 55 in the passage layer 51B and the longitudinal direction of the plurality of linear passages 55 in the passage layer 51C are skewed 60 degrees. Note that the longitudinal direction of the plurality of linear passages 55 in the passage layer 51B and the longitudinal direction of the plurality of linear passages 55 in the passage layer 51C may cross each other at 120 degrees in planar view in the direction along the Z axis.

Note that the number of the passage layers 51 is not limited to three. For example, when the first passage 41 and the second passage 42 includes four passage layers 51, the longitudinal direction of a plurality of linear passages 55 in one passage layer 51 and the longitudinal direction of a plurality of linear passages 55 in another passage layer 51 adjacent to the passage layer 51 cross each other at 45 degrees in planar view in the direction along the Z axis.

In each passage layer 51, the linear passages 55 are spaced apart from each other in the direction crossing the longitudinal directions of the linear passages 55 and crossing the direction in which the passage layers 51 are stacked. Note that the plurality of linear passages 55 may be aligned in another direction.

As illustrated in FIG. 15, in planar view in the direction along the Z axis, the plurality of linear passages 55 in the passage layer 51A crosses the plurality of linear passages 55 in the passage layer 51B. Furthermore, the plurality of linear passages 55 in the passage layer 51B crosses the plurality of linear passages 55 in the passage layer 51C. The connection passages 52 are each arranged at a position where linear passages 55 in the passage layers 51A and 51B cross each other and a position where linear passages 55 in the passage layers 51B and 51C cross each other. Note that the connection passages 52 may be provided at other positions.

For example, one connection passage 52 connects one linear passage 55 in the passage layer 51A to one linear passage 55 in the passage layer 51B. Furthermore, another connection passage 52 connects one linear passage 55 in the passage layer 51B to one linear passage 55 in the passage layer 51C. Each of the connection passages 52 according to the fourth embodiment extends in the direction along the Z axis.

The positions where the plurality of linear passages 55 in the passage layer 51A crosses the plurality of linear passages 55 in the passage layer 51B are different from the positions where the plurality of linear passages 55 in the passage layer 51B crosses the plurality of linear passages 55 in the passage layer 51C. Therefore, in planar view in the direction along the Z axis, a connection passage 52 connecting a linear passage 55 in the passage layer 51A to a linear passage 55 in the passage layer 51B is provided at a position other than that of a connection passage 52 connecting a linear passage 55 in the passage layer 51B to a linear passage 55 in the passage layer 51C.

The linear passages 55 in the passage layer 51B are connected to the respective linear passages 55 in the passage layer 51A through the plurality of connection passages 52. Furthermore, the linear passages 55 in the passage layer 51B are connected to the respective linear passages 55 in the passage layer 51C through the plurality of connection passages 52.

Two adjacent linear passages 55 in the passage layer 51B are connected to each other through one linear passage 55 in the passage layer 51A and two connection passages 52. Furthermore, two adjacent linear passages 55 in the passage layer 51B are connected to each other through one linear passage 55 in the passage layer and two connection passages 52.

A cross-sectional area of a connection passage 52 viewed in the direction along the Z axis is smaller than a cross-sectional area of a linear passage 55 viewed in the direction in which a linear passage 55 extends. Therefore, a pressure loss of the gas G1 or G2 flowing in a linear passage 55 is smaller than a pressure loss of the gas G1 or G2 passing through a connection passage 52. Therefore, the gases G1 or G2 easily diffuses in the linear passages 55 in each passage layer 51 rather than flowing into the connection passage 52.

As illustrated in FIG. 16, the first passage 41 includes a plurality of first closed path portions 61 connected to each other. Each of the first closed path portions 61 according to the fourth embodiment includes four first extending portions 61a and four first connection portions 61b.

Two of the four first extending portions 61a extend in parallel in the direction (e.g., in the direction along the X axis), and the other two of the four first extending portions 61a extend in parallel in another direction (e.g., on an X-Y plane in the direction inclined 60 degrees relative to the X axis). The four first connection portions 61b each connect an end portion of one first extending portion 61a to an end portion of another first extending portion 61a.

For example, linear passages 55 in the passage layer 51A include a plurality of first extending portions 61a connected to each other in the direction along the X axis. Linear passages 55 in the passage layer 51B include a plurality of first extending portions 61a connected to each other on an X-Y plane in the direction inclined 60 degrees relative to the X axis. Linear passages 55 in the passage layer 51C include a plurality of first extending portions 61a connected to each other on an X-Y plane in the direction inclined 120 degrees relative to the X axis.

The second passage 42 includes the plurality of second closed path portions 62 connected to each other. Each of the second closed path portions 62 according to the fourth embodiment includes four second extending portions 62a and four second connection portions 62b.

Two of the four second extending portions 62a extend in parallel in the direction, and the other two of the four second extending portions 62a extend in parallel in another direction. The four second connection portions 62b each connect an end portion of one second extending portion 62a to an end portion of another second extending portion 62a.

As illustrated in FIG. 12, the linear passages 55 of the first passage 41 and the linear passages 55 of the second passage 42 are alternately arranged in the direction in which the linear passages 55 are arranged. In the direction along the Z axis, the passage layer 51A of the first passage 41 and the passage layer 51A of the second passage 42 are arranged at substantially the same position, the passage layer 51B of the first passage 41 and the passage layer 51B of the second passage 42 are arranged at substantially the same position, and the passage layer 51C of the first passage 41 and the passage layer 51C of the second passage 42 are arranged at substantially the same position.

As in the first embodiment, the first passage 41 and the second passage 42 have substantially geometrically the same shape. For example, the first passage 41 coincides with the second passage 42, when rotated about the Z axis. The first passage 41 has a volume substantially the same as the volume of the second passage 42.

As illustrated in FIG. 15, when viewed in the direction along the Z axis, the first openings 43 and the second openings 44 are each provided at a position other than that of a connection passage 52 connecting a linear passage 55 in the passage layer 51A to a linear passage 55 in the passage layer 51B. In planar view in the direction along the Z axis, the first openings 43 and the second openings 44 are each arranged at a position of an apex of a tiled triangle. Note that the first opening 43 and the second opening 44 may be positioned at other positions.

In planar view in the direction along the Z axis, a distance between a connection passage 52 connecting a linear passage 55 in the passage layer 51A to a linear passage 55 in the passage layer 51B and a connection passage 52 connecting a linear passage 55 in the passage layer 51B to a linear passage 55 in the passage layer 51B is substantially the same as a distance between the connection passage 52 connecting a linear passage 55 in the passage layer 51A to a linear passage 55 in the passage layer 51B and a first opening 43 or a second opening 44. In planar view in the direction along the Z axis, one connection passage 52 connecting a linear passage 55 in the passage layer 51A to a linear passage 55 in the passage layer 51B, one connection passage 52 connecting a linear passage 55 in the passage layer 51B to a linear passage 55 in the passage layer 51B, and one first opening 43 or second opening 44 are arranged in a triangular shape substantially at an equal distance.

In the semiconductor manufacturing apparatus 10 according to the fourth embodiment described above, the longitudinal direction of the linear passages 55 in one passage layer 51 crosses the longitudinal direction of the linear passages 55 of the different passage layer 51 adjacent to the passage layer 51, in planar view in the direction in which the passage layers 51 are stacked. In other words, the longitudinal direction of the linear passages 55 in one passage layer 51 and the longitudinal direction of the linear passage 55 of the different passage layer 51 adjacent to the passage layer 51 are skewed relative to each other. That is, the direction in which the gas G1 or G2 flows in one linear passage 55 of a passage layer 51 is different from the direction in which the gas G1 or G2 flows in a linear passage 55 of a passage layer 51 adjacent to the passage layer 51. Thus, the gas G1 or G2 readily diffuses in the first passage 41 or the second passage 42. Accordingly, the shower plate 13 can discharge the gas G1 or G2 more uniformly from a plurality of first openings 43 or a plurality of second openings 44.

The longitudinal direction of the linear passage 55 in one passage layer 51 and the longitudinal direction of the linear passage 55 the different passage layer 51 adjacent to the passage layer 51 cross each other at an angle which is a multiple of an angle obtained by dividing 180 degrees by the number of passage layers 51 and is smaller than 180 degrees. Thus, the first gas G1 and the second gas G2 readily diffuse in the first passage 41 or the second passage 42. Accordingly, the shower plate 13 can discharge the gas G1 or G2 more uniformly from a plurality of first openings 43 or a plurality of second openings 44.

A position of the connection passage 52 connecting the linear passage 55 in the passage layer 51A to the linear passage 55 in the passage layer 51B, a position of the connection passage 52 connecting the linear passage 55 in the passage layer 51B to the linear passage 55 in the passage layer 51B, and a position of the first opening 43 or the second opening 44 are different from each other. Therefore, the gas G1 or G2 passing through the connection passage 52 turns in the linear passage 55 and moves to the next connection passage 52, the first opening 43, or the second opening 44. Accordingly the gas G1 or G2 readily diffuses in the first passage 41 or the second passage 42. Accordingly, the shower plate 13 can discharge the gas G1 or G2 more uniformly from the plurality of first openings 43 or the plurality of second openings 44.

Figure 17:
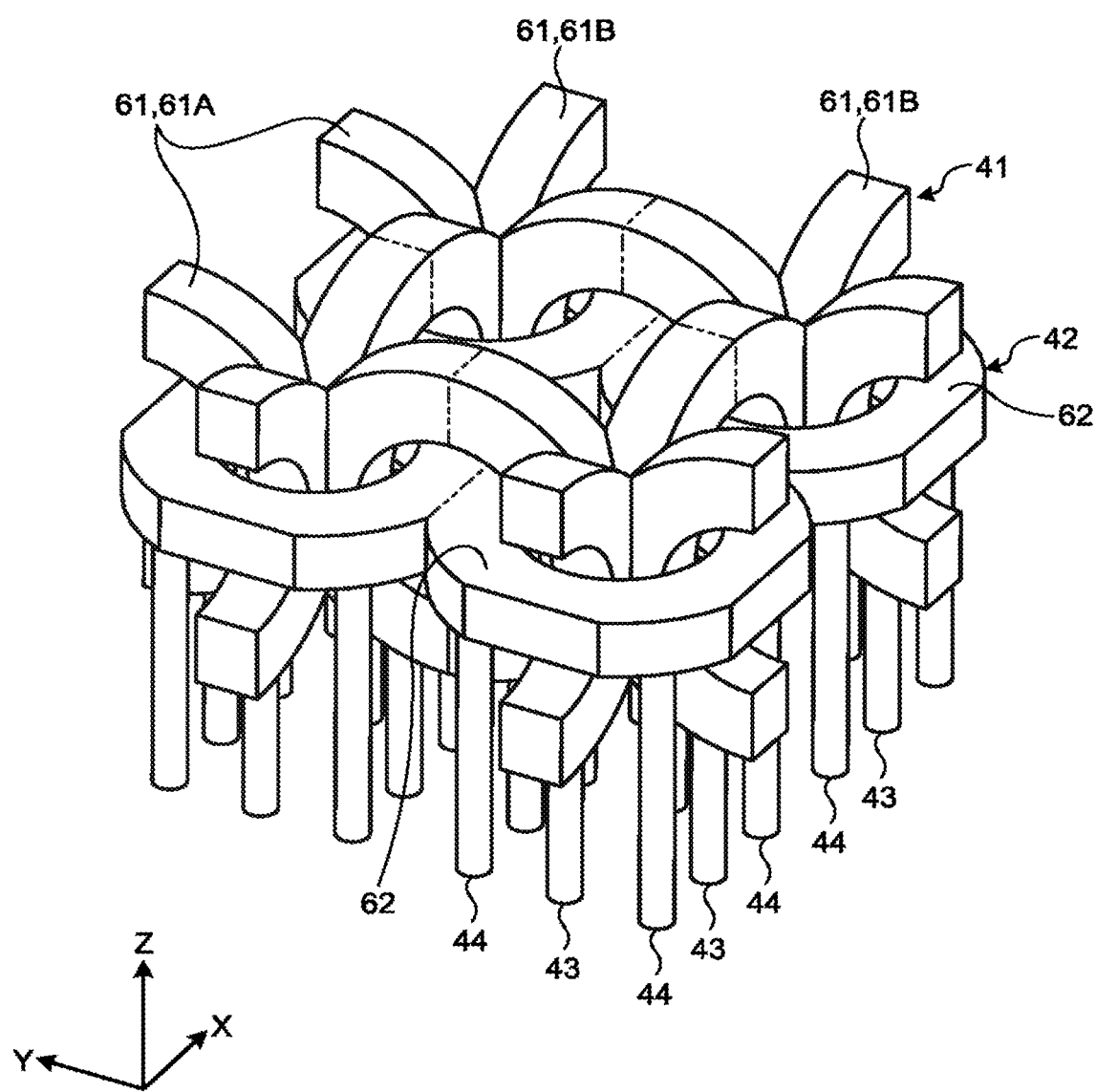
FIG. 17 is a perspective view partially illustrating first and second passages and first and second openings according to a fifth embodiment.
Figure 18:
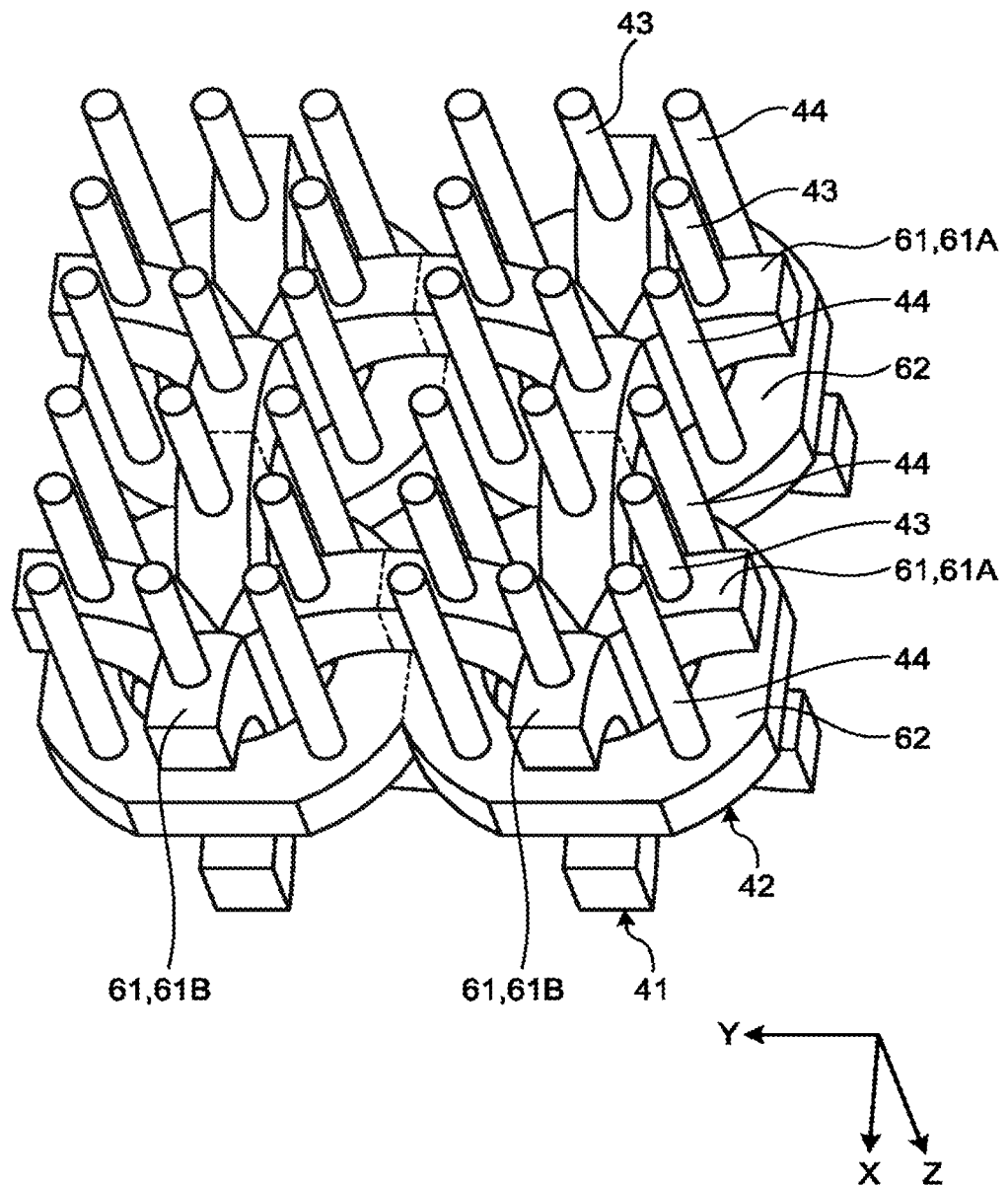
FIG. 18 is a perspective view partially illustrating the first passage, the second passage, the first opening, and the second opening according to the fifth embodiment which are viewed from the opposite side of FIG. 17.

Hereinafter, a fifth embodiment will be described with reference to FIGS. 17 and 18. FIG. 17 is a perspective view partially illustrating first and second passages 41 and 42 and first and second openings 43 and 44 according to the fifth embodiment. FIG. 18 is a perspective view partially illustrating the first passage 41, the second passage 42, the first opening 43, and the second opening 44 according to the fifth embodiment which are viewed from the opposite side of FIG. 17. In FIGS. 17 and 18, the diffusing unit 31 is omitted, and the first and second passages 41 and 42 and the first and second openings 43 and 44 are illustrated. That is, FIGS. 17 and 18 illustrate a space formed by the first passage 41, the second passage 42, the first opening 43, and the second opening 44.

As illustrated in FIG. 17, a first closed path portion 61 according to the fifth embodiment is formed in an annular shape. The plurality of first closed path portions 61 may be individually referred to as first closed path portions 61A and first closed path portions 61B.

The first closed path portion 61A is formed in an annular shape expanding on a Y-Z plane. The first closed path portions 61A are connected to each other in the direction along the Y axis. The first closed path portion 61B is formed in an annular shape expanding on an X-Z plane. The first closed path portions 61B are connected to each other in the direction along the X axis. At a position where two first closed path portions 61A are connected to each other, two first closed path portions 61B are also connected to each other.

A second closed path portion 62 according to the fifth embodiment is formed in an annular shape expanding on an X-Y plane. The second closed path portions 62 are connected to each other in the direction along the X axis and further connected to each other in the direction along the Y axis.

The first closed path portions 61 pass through the second closed path portions 62 while being isolated from the second closed path portions 62. Furthermore, the second closed path portions 62 pass through the first closed path portions 61 while being isolated from the first closed path portions 61.

As illustrated in FIG. 18, from one first closed path portion 61, two first openings 43 extend in the direction along the Z axis. The two first openings 43 extending from the one first closed path portion 61 are separated from each other. Furthermore, from one second closed path portion 62, four second openings 44 extend in the direction along the Z axis. The second openings 44 pass between two adjacent first closed path portions 61 in the direction along the X axis, and between two adjacent first closed path portions 61 in the direction along the Y axis, and extend in the direction along the Z axis.

In the semiconductor manufacturing apparatus 10 according to the fifth embodiment described above, the first closed path portions 61 and the second closed path portions 62 are each formed in an annular shape. Thus, the gas G1 or G2 is unlikely to move straight forward in the first passage 41 or the second passage 42, and the first gas G1 and the second gas G2 readily diffuses in the first passage 41 or the second passage 42. Accordingly, the shower plate 13 can discharge the gas G1 or G2 more uniformly from the plurality of first openings 43 or the plurality of second openings 44.

The first to fifth embodiments as described above, the shower plate 13 is provided with two routes of passages (paths) of the first passage 41 and the second passage 42. However, the shower plate 13, as an example of a flow passage structure and a member, may be provided at least three paths.

Furthermore, the gases (the first gas G1 and the second gas G2) fed from the plurality of different passages (the first passage 41 and the second passage 42) may be fed into the chamber 21 at the same time to be mixed in the chamber 21. In contrast, the plurality of kinds of gases may be switched to be fed into the chamber 21, without changing the chamber 21. In this configuration, different processing, such as, lamination of different films, film forming and cleaning, or cleaning and film forming, can be switched immediately.

According to the respective embodiments described above including the modifications, until gases are fed (released) from the diffusing unit 31 into the chamber 21, the gases are separated from each other in the plurality of corresponding different passages (the first passage 41 and the second passage 42). Thus, particles, intermediate reaction products, and by-products, generated in a reaction caused by mixing the gases, are suppressed from being generated.

Figure 19:
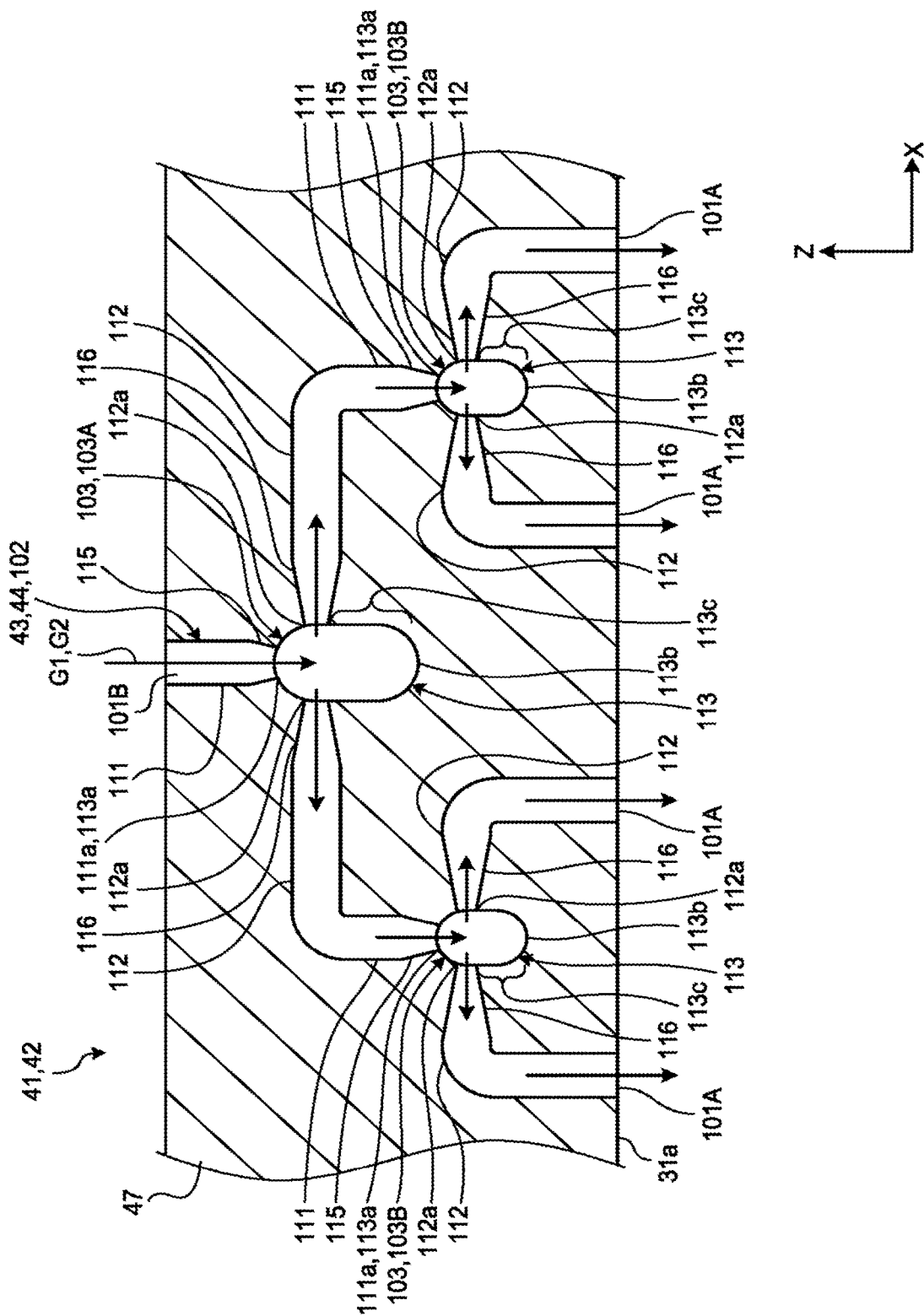
FIG. 19 is a cross-sectional view partially illustrating a bottom wall according to a sixth embodiment.

Hereinafter, a sixth embodiment will be described with reference to FIGS. 19 and 21. FIG. 19 is a cross-sectional view partially illustrating the bottom wall 47 according to the sixth embodiment. As illustrated in FIG. 19, a first opening 43 and a second opening 44 according to the sixth embodiment are each branched. The first opening 43 and the second opening 44 each include a plurality of opening ends 101A, an opening end 101B, a flow passage 102, and a plurality of branching portions 103.

The opening ends 101A open to the bottom surface 31a. The opening ends 101A are provided in the first opening 43 and the second opening 44 at one end. In other words, the opening ends 101A are formed by the edges in the bottom surface 31a, positioned at an end of the first opening 43 and the second opening 44.

The opening end 101B opens to a surface opposite to the bottom surface 31a of the bottom wall 47. In other words, the opening end 101B opens to the first passage 41 or the second passage 42. The opening end 101B is provided at the end of the first opening 43 and the second opening 44. In other words, the opening end 101B is formed by the edge of the surface opposite to the bottom surface 31a positioned at the end of the first opening 43 and the second opening 44.

The flow passage 102 connects the opening end 101B opening to the first passage 41 or the second passage 42 to at least two opening ends 101A. That is, at least two opening ends 101A are connected to one opening end 101B through the flow passage 102.

The plurality of branching portions 103 is provided in the flow passage 102. In other words, the branching portions 103 are a part of the flow passage 102. The plurality of branching portions 103 each includes a first extension passage 111, a plurality of second extension passages 112, and a gas reservoir 113. The first extension passage 111 is an example of an upstream passage. The second extension passages 112 are an example of downstream passages. The gas reservoir 113 is an example of a cavity and, for example, also referred to as stagnant portion or coupling portion.

The first extension passage 111 extends in the direction along the Z axis. Note that the first extension passage 111 may extend in other directions, or may extend in a curved shape. The plurality of second extension passages 112 each extend in the direction crossing the direction in which the first extension passage 111 extends. In FIG. 19, the plurality of second extension passages 112 extends in the direction along the X axis. The second extension passages 112 may extend in other directions, such as the direction along the Y axis.

In the flow passage 102, each of the plurality of second extension passages 112 is closer to the opening end 101A than the first extension passage 111. In other words, when the gas G1 or G2 flows from the opening end 101B to the opening end 101A, the first extension passage 111 is positioned on the upstream side more than the second extension passages 112, and the second extension passages 112 are positioned on the downstream side more than the first extension passage 111. Therefore, the distance between the first extension passage 111 and the opening end 101A may be shorter than the distance between the second extension passage 112 and the opening end 101A.

The first extension passage 111 includes a first connection end portion 111a. The first connection end portion 111a is one end portion of the first extension passage 111 in the direction along the Z axis. The first connection end portion 111a includes not only the end of the first extension passage 111 but also a part of the first extension passage 111 adjacent to the end.

The plurality of second extension passages 112 each include a second connection end portion 112a. The second connection end portion 112a is an example of the upstream side of each of the downstream passages. Each of the second connection end portions 112a is one end portion of a second extension passage 112 in the direction (direction along the X axis) in which the second extension passage 112 extends. The second connection end portion 112a includes not only the end of the second extension passage 112 but also a part of the second extension passage 112 adjacent to the end.

The gas reservoir 113 is positioned between the first extension passage 111 and the plurality of second extension passages 112. To the gas reservoir 113, the first extension passage 111 and the plurality of second extension passages 112 are connected. In other words, the first extension passage 111 opens to the gas reservoir 113, and further, each of the plurality of second extension passages 112 opens to the gas reservoir 113.

To the gas reservoir 113, the first connection end portion 111a of the first extension passage 111 is connected. In other words, in the first connection end portion 111a, the first extension passage 111 and the gas reservoir 113 are connected.

Furthermore, to the gas reservoir 113, a second connection end portion 112a of a second extension passage 112 is connected In other words, at the second connection end portion 112a, the second extension passage 112 and the gas reservoir 113 are connected.

In the present embodiment, the gas reservoir 113 is formed in a substantially ellipsoidal shape or a prolate spheroid shape extending in the direction along the Z axis. The gas reservoir 113 may be formed in other shapes. The gas reservoir 113 includes a first end portion 113a and a second end portion 113b.

The first end portion 113a is one end portion of the gas reservoir 113 in the direction along the Z axis. The second end portion 113b is the other end portion of the gas reservoir 113 in the direction along the Z axis. That is, the second end portion 113b is on an opposite side of the first end portion 113a.

The first connection end portion 111a of the first extension passage 111 is connected to the first end portion 113a. A second connection end portion 112a of a second extension passage 112 is, in the direction along the axis, connected to the gas reservoir 113 at a position separated from the second end portion 113b.

The first extension passage 111 is connected to the plurality of second extension passages 112 through the gas reservoir 113. In other words, the plurality of second extension passages 112 is branched from one first extension passage 111. The plurality of second extension passages 112 extends radially, for example, from the gas reservoir 113.

The gas reservoir 113 includes a storage portion 113c. The storage portion 113c is a part of the gas reservoir 113, and is a portion between the second connection end portion 112a and the second end portion 113b in the direction along the Z axis.

A branching portion 103 further includes a first narrowed portion 115 and a plurality of second narrowed portions 116. The first narrowed portion 115 is positioned at the first connection end portion 111a of the first extension passage 111. In other words, the first narrowed portion 115 is positioned between the first extension passage 111 and the gas reservoir 113. In the present embodiment, in planar view in the direction along the axis, the cross-sectional area of the first narrowed portion 115 is smaller than the cross-sectional area of the different portion of the first extension passage 111.

For example, the cross-sectional area of the first narrowed portion 115 decreases with decreasing distance to the gas reservoir 113. In other words, the first narrowed portion 115 is tapered toward the gas reservoir 113. The first narrowed portion 115 may be a portion whose cross-sectional area is reduced, for example, by the wall projecting from an inner surface of the first extension passage 111. Note that the branching portion 103 may not have the first narrowed portion 115. In other words, the cross-sectional area of the first extension passage 111 may be constant.

The second narrowed portion 116 is positioned at the second connection end portion 112a of each of the plurality of second extension passages 112. In other words, the second narrowed portion 116 is positioned between the second extension passage 112 and the gas reservoir 113. In the present embodiment, in planar view in the direction in which the second extension passage 112 extends, the cross-sectional area of the second narrowed portion 116 is smaller than the cross-sectional area of the different part of the second extension passage 112.

For example, the cross-sectional area the second narrowed portion 116 decreases with decreasing distance to the gas reservoir 113. In other words, the second narrowed portion 116 is tapered toward the gas reservoir 113. The second narrowed portion 116 may be a portion whose cross-sectional area is reduced, for example, by a wall projecting from an inner surface of the second extension passage 112.

In the first opening 43 and the second opening 44, the second narrowed portion 116 is a portion whose cross-sectional area is smaller than that of the upstream section adjacent to the upstream of the second narrowed portion 116. Therefore, the cross-sectional area of the second narrowed portion 116 and the cross-sectional area of the second extension passage 112 may be the same.

The cross-sectional area of a portion where each of the second extension passages 112 is connected to the gas reservoir 113 is smaller than the cross-sectional area of a portion where the first extension passage 111 is connected to the gas reservoir 113. In other words, the minimum cross-sectional area of the second narrowed portion 116 is smaller than the minimum cross-sectional area of the first narrowed portion 115.

In planar view in the direction along the Z axis, the maximum cross-sectional area of the gas reservoir 113 is larger than the minimum cross-sectional area of the first narrowed portion 115. Furthermore, in the present embodiment, the maximum cross-sectional area of the gas reservoir 113 is larger than the maximum cross-sectional area of the first extension passage 111. Note that the maximum cross-sectional area of the gas reservoir 113 is not limited thereto.

As illustrated in FIG. 19, the first opening 43 and the second opening 44 according to the sixth embodiment are each branched off twice. Hereinafter, for the sake of description, the plurality of branching portions 103 may be individually referred to as branching portions 103A and 103B. The description common to the branching portions 103A and 103B is made as description of the branching portion 103.

The plurality of branching portions 103 includes one branching portion 103A and a plurality of branching portions 103B. The branching portion 103A is a branching portion 103 in the first layer, and each of the branching portions 103B is a branching portion 103 in the second layer.

The first extension passage 111 of the branching portion 103A is connected to the opening end 101B. The second extension passages 112 of the branching portion 103A are connected to the first extension passages 111 of the branching portions 103B. The second extension passages 112 of the branching portions 103B are connected to the opening ends 101A.

The volume of the gas reservoir 113 of the branching portion 103A is larger than the volume of the gas reservoir 113 of the branching portion 103B. The minimum cross-sectional area of the second narrowed portion 116 of the branching portion 103A is larger than the minimum cross-sectional area of the second narrowed portion 116 of the branching portion 103B. Note that the shapes of the branching portion 103A and the branching portions 103B are not limited thereto.

As indicated by arrows in FIG. 19, the first gas G1 or the second gas G2 (gas G1 or G2) flows into the first opening 43 and the second opening 44 from the opening end 101B. In the branching portion 103A, the gas G1 or G2 flows into the gas reservoir 113 from the first extension passage 111.

The minimum cross-sectional area of the second narrowed portion 116 is smaller than the maximum cross-sectional area of the gas reservoir 113. Therefore, the gas G1 or G2 easily stays in the gas reservoir 113 rather than passing through the second narrowed portion 116 and flowing into the second extension passage 112. Therefore, the gas G1 or G2 passes the second extension passage 112 that opens to the gas reservoir 113, and easily flows toward the storage portion 113c of the gas reservoir 113. The gas G1 or G2, after having stayed in the gas reservoir 113, passes through the plurality of second narrowed portions 116 and flows out to the plurality of second extension passages 112.

The gas G1 or G2 that flowed out to each of the second extension passages 112 of the branching portion 103A flows into the gas reservoir 113 from the first extension passage 111, in the branching portion 103B. In the branching portion 103B, too, the gas G1 or G2, after having stayed in the gas reservoir 113, passes through the plurality of second narrowed portions 116 and flows out to the plurality of second extension passages 112. The gas G1 or G2 passes through the second extension passages 112 and is discharged the opening ends 101A.

As described above, the gas G1 or G2 is stayed in the gas reservoir 113, before passing through the plurality of second narrowed portions 116 and flowing out to the plurality of second extension passages 112. Therefore, the flow rates of the gas G1 and G2 flowing into the plurality of the second extension passages 112 are restrained from being varied, due to the influence of the flow in the first extension passage 111.

Figure 20:
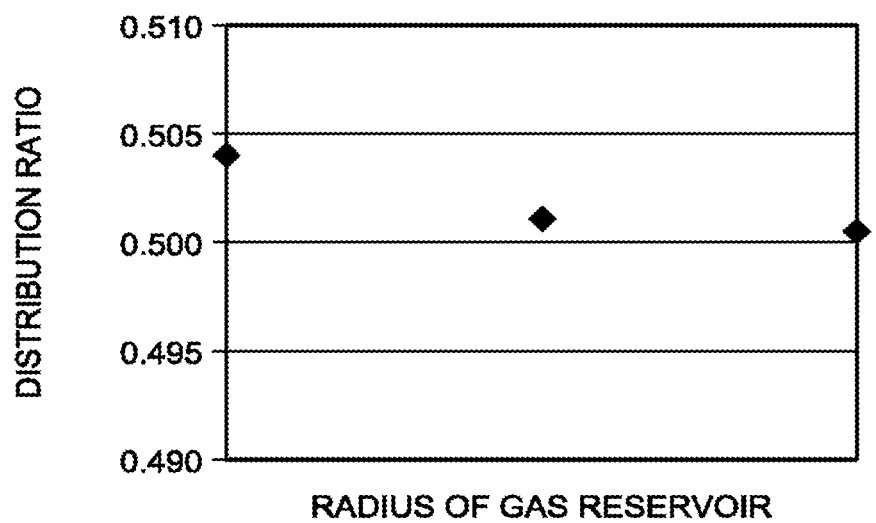
FIG. 20 is a graph illustrating a distribution ratio of a gas toward second extension passages to a radius of a gas reservoir according to the sixth embodiment.

Hereinafter, an example of the flow of the gas G1 or G2 in a branching portion 103 including the gas reservoir 113 and the second narrowed portions 116 will be described, with reference to FIGS. 20 and 21. FIG. 20 is a graph illustrating a distribution ratio of the gas G1 or G2 toward the second extension passages 112 to the radius of the gas reservoir 113 according to the sixth embodiment. FIG. 21 is a graph illustrating a distribution ratio of the gas G1 or G2 toward the second extension passages 112 to the minimum radius of the second narrowed portion 116 according to the sixth embodiment.

Figure 21:
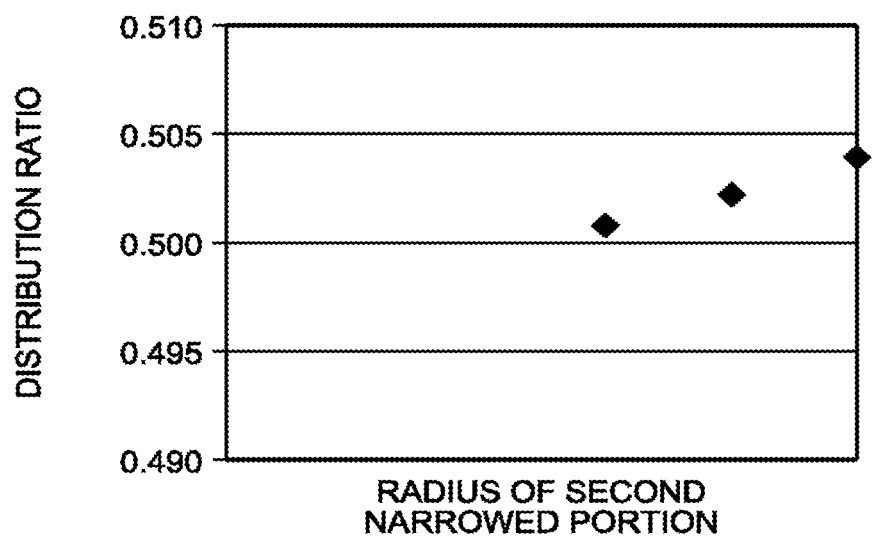
FIG. 21 is a graph illustrating a distribution ratio of the gas toward the second extension passages to the minimum radius of a second narrowed portion according to the sixth embodiment.

The graphs of FIGS. 20 and 21 illustrate an example of the distribution ratio of the gas G1 or G2 toward the second extension passages 112 under the following conditions:

The portion where the first extension passage 111 is connected to a gas reservoir 113 is formed in a substantially rectangular shape.

The branching portion 103 includes two second extension passages 112 extending in directions opposite to each other.

The portion where the second extension passage 112 is connected to the gas reservoir 113 is formed in a circular shape and has the same radius as that of the second extension passage 112. In FIG. 21, the radius of the second extension passage 112 is varied.

The gas reservoir 1 formed in a columnar shape. In FIG. 20, the radius of the gas reservoir 113 is varied.

As illustrated in FIG. 20, the distribution ratio gets closer to 0.5 as the radius of the gas reservoir 113 (volume of the gas reservoir 113) becomes larger. When the distribution ratio is 0.5, the gas G1 or G2 flows to the two second extension passages 112 evenly. As described above, the gas G1 or G2 flows to the plurality of second extension passages 112 evenly as the volume of the gas reservoir 113 is larger.

As illustrated in FIG. 21, the distribution ratio gets closer to 0.5 as the minimum radius of the second narrowed portion 116 (minimum cross-sectional area of the second narrowed portion 116) becomes smaller. As described above, the gas G1 or G2 flows to the second extension passages 112 evenly as the minimum cross-sectional area of the second narrowed portion 116 is smaller.

In the semiconductor manufacturing apparatus 10 according to the sixth embodiment described above, the first opening 43 and the second opening 44 each include the plurality of second narrowed portions 116 each positioned at the second connection end portion 112a of the second extension passage 112. Such first opening 43 and second opening 44 according to the present embodiment can, as compared with when the second narrowed portion 116 is not provided, reduce the variation due to the position in the velocity and pressure of the gas G1 or G2 on the upstream side of a second narrowed portion 116. Accordingly, in the second narrowed portions 116 and in the respective downstream sections adjacent to the downstream thereof, the variation of the flow rate of the gas G1 or G2 can be further reduced.

The first opening 43 and the second opening 44 include the gas reservoir 113 as a cavity positioned between one first extension passage 111 and a plurality of second extension passages 112. Such first opening 43 and second opening 44 according to the present embodiment can, as compared with when the gas reservoir 113 is not provided, reduce the variation due to the position in the velocity and pressure of the gas G1 or G2 on the upstream side of the gas reservoir 113. Accordingly, in the gas reservoirs 113 and in the respective downstream sections adjacent to the downstream thereof can be further reduced.

In the branching portion 103B on the downstream side, a portion where the gas reservoir 113 can be formed is small. However, the volume of the gas reservoir 113 of the branching portion 103B is smaller than the volume of the gas reservoir 113 of the branching portion 103A. Therefore, the gas reservoir 113 of the branching portion 103B can be easily provided.

The flow velocity of the gas G1 or G2 in the branching portion 103B on the downstream side is slower than the flow velocity of the gas G1 or G2 in the branching portion 103A on the upstream side. However, the minimum cross-sectional area of the second narrowed portion 116 of the branching portions 103B is smaller than the minimum cross-sectional area of the second narrowed portion 116 of the branching portion 103A. Thus, the difference in pressure between the upstream side and the downstream side of the second narrowed portion 116 is ensured, and the variation due to the position in the velocity and pressure of the gas G1 or G2 in the second narrow portion 116 on the upstream side can be reduced.

Figure 22:
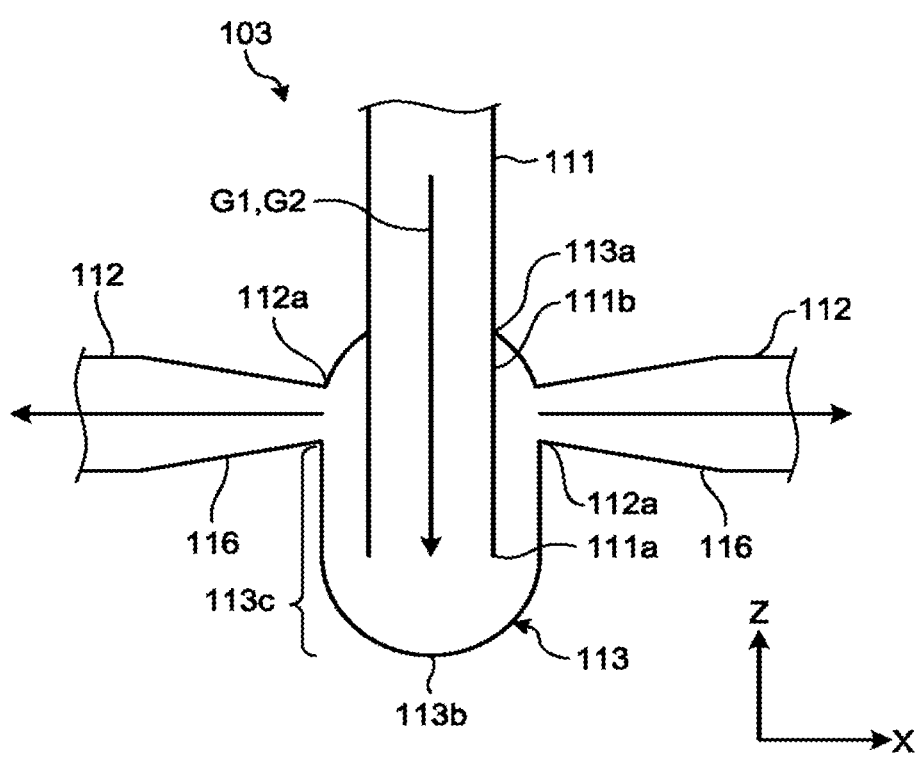
FIG. 22 is a schematic diagram illustrating a branching portion according to a modification of the sixth embodiment.

FIG. 22 is a schematic diagram illustrating a branching portion 103 according to a modification of the sixth embodiment. As illustrated in FIG. 22, the first extension passage 111 may have an extension portion 111b. The extension portion 111b is a part of the first extension passage 111 and extends from the first end portion 113a toward the second end portion 113b of the gas reservoir 113.

The extension portion 111b is provided so that the first extension passage 111 opens to the gas reservoir 113 on the inside of the gas reservoir 113. The first extension passage 111 opens to the gas reservoir 113 at a position closer to the second end portion 113b than the second extension passage 112. Therefore, the flow rate of the gas G1 or G2 flowing into the plurality of the second extension passages 112 are restrained from being varied, due to the influence of the flow in the first extension passage 111.

In the plurality of embodiments described above, the shower plate 13 as an example of the flow passage structure discharges the first gas G1 and the second gas G2 from the first openings 43 and the second openings 44. However, the flow passage structure may suck the first fluid and the second fluid, for example, from the first openings and the second openings.

According to at least one embodiment described above, the first passage and the second passage each include the plurality of closed path portions connected to each other. Thus, the flow passage structure is capable of being further evenly discharging or sucking a fluid from the plurality of first openings or the plurality of second openings.

While a number of embodiments of the invention have been exemplified in the foregoing, those embodiments are presented as mere examples and are not intended to limit the scope of the invention. Those novel embodiments described herein y be embodied in various other forms and, without departing from the scope of the invention, various omissions, substitutions, and modifications can be performed. Those embodiments and the modification thereof are included in the scope and spirit of the invention and are included in the scope of the invention stated in the appended claims and the scope of the equivalents thereof.

The invention claimed is:

1. A flow passage structure comprising
a member including a surface and provided with:
 a first passage including a plurality of first closed path portions connected to each other;
 a plurality of first openings connected to the first passage and opened on the surface;
 a second passage including a plurality of second closed path portions connected to each other; and
 a plurality of second openings connected to the second passage and opened on the surface,
 the first closed path portions passing through the second closed path portions while being isolated from the second closed path portions, and the second closed path portions passing through the first closed path portions while being isolated from the first closed path portions.

2. The flow passage structure according to claim 1, wherein
the first passage and the second passage each include:
 a plurality of passage layers each including a plurality of linear passages and separately stacked, the linear passages in each of the passage layers being spaced apart in a direction crossing longitudinal directions of the linear passages and crossing a direction in which the passage layers are stacked; and
 a plurality of connection passages that connect the linear passages in two adjacent passage layers to each other, and are spaced apart from each other in the longitudinal directions of the linear passages,
the linear passages in one of the passage layers are connected to the linear passages in another of the passage layers adjacent to the one of the passage layers via the connection passages, and
the linear passages of the first passage and the linear passages of the second passage are alternately arranged in a direction in which the linear passages are arranged.

3. The flow passage structure according to claim 2, wherein the linear passages of the first passage and the second passage extend in parallel.

4. The flow passage structure according to claim 2, wherein
the first passage and the second passage each include a plurality of layers each including a plurality of the passage layers adjacent to each other,
the linear passages in the respective layers extend in parallel, and
the longitudinal direction of the linear passages in one of the layers crosses the longitudinal direction of the linear passages of another of layers adjacent to the one of the layers, in planar view in the direction in which the passage layers are stacked.

5. The flow passage structure according to claim 2, wherein
the first passage and the second passage each include a plurality of layers each including a plurality of the passage layers adjacent, to each other,
the number of the first closed path portions included in one of the layers is larger than the number of the first closed path portions included in another of the layers separated farther from the surface than the one of the layers, and
the number of the second closed path portions included in one of the layers is larger than the number of the second closed path portions included in another of the layers separated farther from the surface than the one of the layers.

6. The flow passage structure according to claim 2, wherein the longitudinal direction of the linear passages in one of the passage layers crosses the longitudinal direction of the linear passages in another of passage layers adjacent to the one of the passage layers, in planar view in the direction in which the passage layers are stacked.

7. The flow passage structure according to claim 6, wherein the longitudinal direction of the linear passages in one of the passage layers and the longitudinal direction of the linear passages in another of the passage layers adjacent to the one of the passage layers cross each other at an angle being a multiple of an angle obtained by dividing 180 degrees by the number of the passage layers and smaller than 180 degrees, in planar view in the direction in which the passage layers are stacked.

8. The flow passage structure according to claim 1, wherein the member is further provided with a first conduit, a plurality of first distribution passages that connect the first conduit to the first passage, a second conduit, and a plurality of second distribution passages that connect the second conduit to the second passage.

9. The flow passage structure according to claim 1, wherein one or both of the first openings and the second openings each includes an upstream passage, a plurality of downstream passages branched from the upstream passage, and a plurality of narrowed portions positioned at respective upstream end portions of the downstream passages.

10. The flow passage structure according to claim 9, wherein
    one or both of the first openings and the second openings each includes a cavity positioned between the upstream passage and the downstream passages,
    the downstream passages each opens to the cavity, and
    the narrowed portions are positioned between the cavity and the downstream passages.

11. A processing apparatus comprising:
    the flow passage structure according to claim 1;
    an object support portion configured to support an object at a position to which the surface is directed;
    a first fluid feeding unit configured to feed a first fluid to the first passage; and
    a second fluid feeding unit configured to feed a second fluid to the second passage.

* * * * *